US009301386B2

(12) United States Patent
Ookawa

(10) Patent No.: US 9,301,386 B2
(45) Date of Patent: Mar. 29, 2016

(54) PRINTED CIRCUIT BOARD AND METHOD OF MANUFACTURING THE SAME

(75) Inventor: Tadao Ookawa, Ibaraki (JP)

(73) Assignee: NITTO DENKO CORPORATION, Ibaraki-shi, Osaka (JP)

( * ) Notice: Subject to any disclaimer, the term of this patent is extended or adjusted under 35 U.S.C. 154(b) by 523 days.

(21) Appl. No.: 13/483,295

(22) Filed: May 30, 2012

(65) Prior Publication Data
US 2012/0318563 A1 Dec. 20, 2012

Related U.S. Application Data

(60) Provisional application No. 61/505,135, filed on Jul. 7, 2011.

(30) Foreign Application Priority Data

Jun. 16, 2011 (JP) ................................. 2011-134195

(51) Int. Cl.
*H05K 1/00* (2006.01)
*H05K 1/11* (2006.01)
*H05K 1/02* (2006.01)

(52) U.S. Cl.
CPC ............ *H05K 1/0245* (2013.01); *H05K 1/0253* (2013.01); *H05K 1/0218* (2013.01); *H05K 2201/09736* (2013.01); *Y10T 29/49128* (2015.01)

(58) Field of Classification Search
CPC . H05K 1/0218; H05K 1/0219; H05K 1/0245; H05K 1/0253; H05K 1/0224; H05K 1/0225; H05K 1/0227; H05K 1/025; H05K 2201/093; H05K 9/0039; H05K 9/0088
USPC .............................. 174/250, 254, 261; 333/33
See application file for complete search history.

(56) References Cited

U.S. PATENT DOCUMENTS

| | | | |
|---|---|---|---|
| 6,894,874 B2 * | 5/2005 | Maruyama et al. | ........ 360/245.9 |
| 6,932,518 B2 * | 8/2005 | Greenlaw | ............... H05K 1/025 361/748 |

(Continued)

FOREIGN PATENT DOCUMENTS

| JP | 2000-101204 A | 4/2000 |
|---|---|---|
| JP | 2002-158411 A | 5/2002 |

(Continued)

OTHER PUBLICATIONS

Office Action issued Aug. 26, 2014 in JP Application No. 2011-134195.

(Continued)

*Primary Examiner* — Chau N Nguyen
*Assistant Examiner* — Roshn Varghese
(74) *Attorney, Agent, or Firm* — Panitch Schwarze Belisario & Nadel LLP

(57) ABSTRACT

A differential transmission path composed of a pair of transmission lines is formed on an upper surface of a base insulating layer. A ground conductor layer is formed on a lower surface of the base insulating layer. The ground conductor layer is opposite to the differential transmission path with the base insulating layer sandwiched therebetween. A spacing between the transmission lines at a part of the differential transmission path is smaller than a spacing between the transmission lines at another part of the differential transmission path. A thickness of a part of the ground conductor layer overlapping the part of the differential transmission path is smaller than the thickness of another part of the ground conductor layer overlapping the another part of the differential transmission path.

16 Claims, 15 Drawing Sheets

(56) References Cited

U.S. PATENT DOCUMENTS

| | | | |
|---|---|---|---|
| 6,963,471 B2 * | 11/2005 | Arai et al. | 360/246 |
| 7,375,286 B2 * | 5/2008 | Honjo | H05K 1/0224 174/250 |
| 2004/0245619 A1 * | 12/2004 | Takeuchi | H01L 23/49827 257/688 |
| 2006/0028305 A1 * | 2/2006 | Dutta et al. | 333/238 |
| 2006/0066417 A1 | 3/2006 | Yamanaga et al. | |
| 2007/0236086 A1 * | 10/2007 | Takagi | H05K 1/147 307/11 |
| 2008/0080155 A1 * | 4/2008 | Ye | H05K 1/0224 361/777 |
| 2009/0263140 A1 | 10/2009 | Kagaya | |
| 2009/0315649 A1 * | 12/2009 | Minegishi et al. | 333/238 |

FOREIGN PATENT DOCUMENTS

| | | |
|---|---|---|
| JP | 2006-128618 A | 5/2006 |
| JP | 2009-266903 A | 11/2009 |

OTHER PUBLICATIONS

Office Action issued Dec. 24, 2014 in JP Application No. 2011-134195.

Office Action issued Jun. 23, 2015 in JP Application No. 2011-134195.

Office Action issued Dec. 24, 2015 in CN Application No. 201210202736.8.

* cited by examiner

F I G. 5
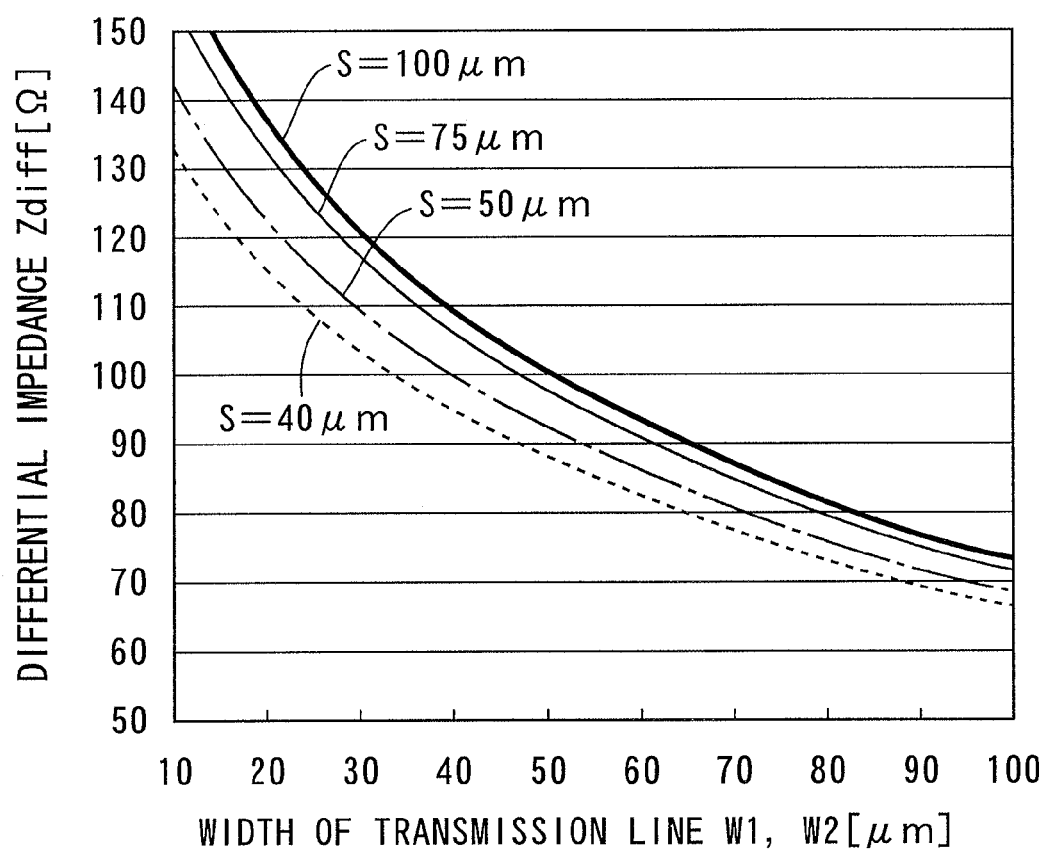

F I G. 9
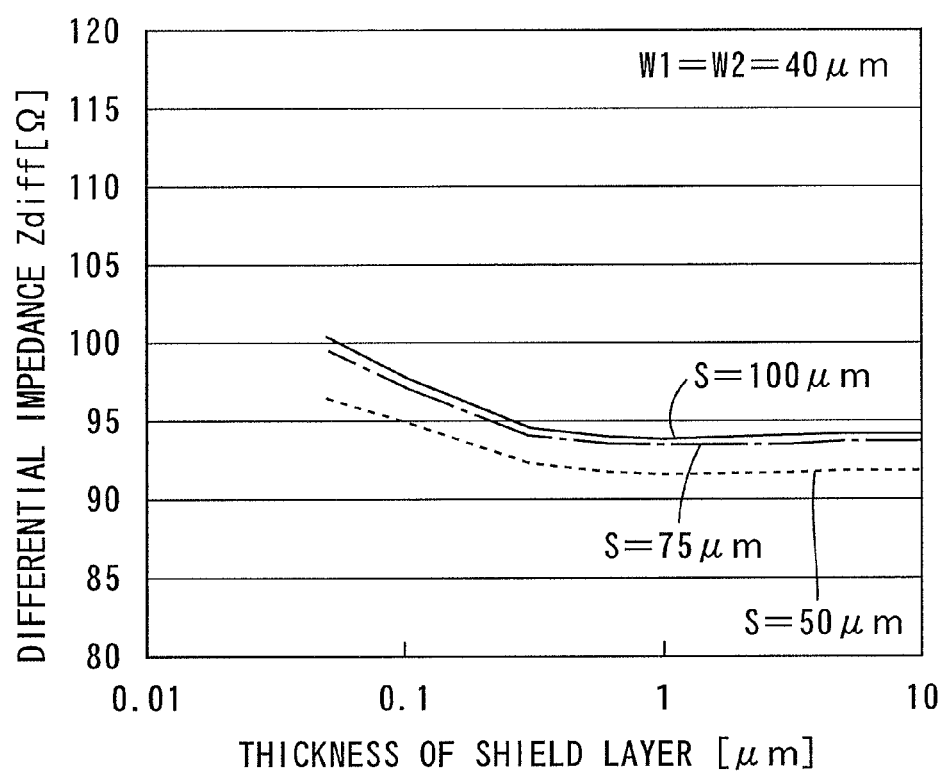

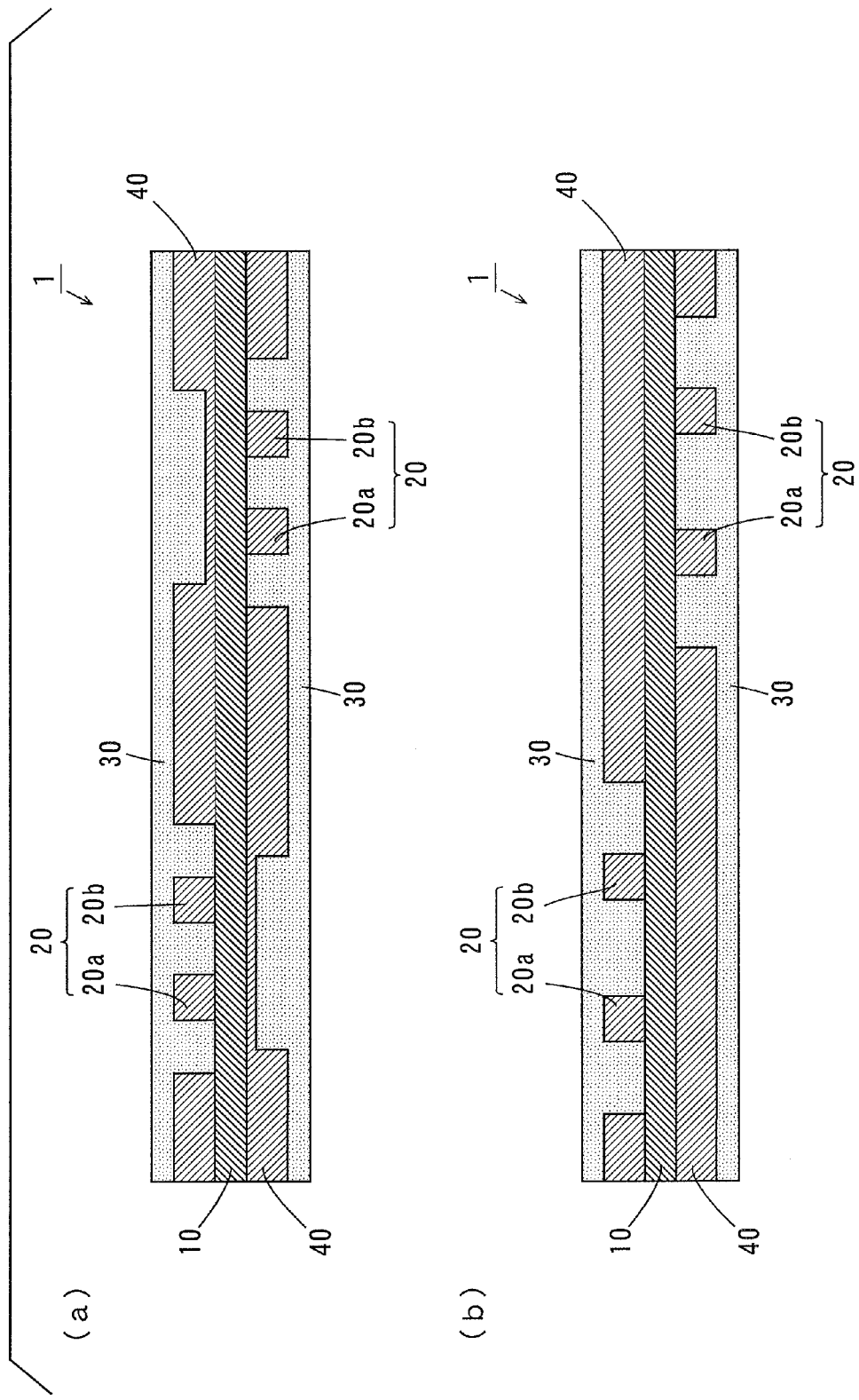

PRINTED CIRCUIT BOARD AND METHOD OF MANUFACTURING THE SAME

BACKGROUND OF THE INVENTION (1) Field of the Invention

The present invention relates to a printed circuit board and a method of manufacturing the same.

(2) Description of Related Art

Flexible printed circuit boards (hereinafter referred to as FPC boards) are used as transmission paths of digital signals between the central processing unit (hereinafter referred to as CPU) and a liquid crystal display in information communication devices such as mobile phones. The FPC board mainly includes an insulating layer and differential transmission paths provided on the insulating layer.

Recently, the digital signals used in information communication devices have higher frequencies due to the increase of information amount transmitted by such devices. In the FPC board, however, high frequency noise may be created by harmonics from the differential transmission path as digital signals of high frequency range are transmitted.

To shut off the high frequency noise, a shield layer made of metal is formed on the insulating layer where the differential transmission path is formed. In this case, transmission loss of digital signals in the differential transmission path is increased. Therefore, there is a limit to high frequency digital signals.

On the other hand, the information amount that the FPC board can transmit can be improved by increasing the number of differential transmission paths. In this case, the freedom of layout of differential transmission paths is limited due to high density configuration of the differential transmission paths. If widths and spacing composing the differential transmission paths is discontinuous in a longitudinal direction of the differential transmission paths, it is difficult to ensure continuity of differential impedance in the differential transmission path.

JP 2002-158411 A describes that the characteristic impedance of one area of the conductor circuit pattern is controlled by reducing the thickness of a part of the insulating layer overlapping the one area of the conductor circuit pattern compared to the thickness of another part of the insulating layer overlapping another area of the conductor circuit pattern. In this case, continuity of differential impedance can be ensured by partially controlling the differential impedance of the differential transmission path to adjust the thickness of the insulating layer. However, when the thickness of the insulating layer cannot be adjusted, it is impossible to ensure the continuity of the differential impedance. Therefore, the freedom of layout of the differential transmission path is limited.

BRIEF SUMMARY OF THE INVENTION

An object of the present invention is to provide a printed circuit board capable of improving the freedom of layout of differential transmission paths, while ensuring continuity of the differential impedance of the differential transmission paths.

(1) A printed circuit board according to an aspect of the present invention includes a first insulating layer a differential transmission path composed of first and second transmission lines, and a first conductor layer. The first conductor layer, the first insulating layer and the differential transmission path are stacked such that the first conductor layer is opposite to the differential transmission path with the first insulating layer sandwiched therebetween. A spacing between the first and second transmission lines at one part of the differential transmission path is smaller than a spacing between the first and second transmission lines at another part of the differential transmission path. A thickness of a part of the first conductor layer overlapping the one part of the differential transmission path is smaller than a thickness of another part of the first conductor layer overlapping the another part of the differential transmission path.

In the printed circuit board, the spacing between the first and second transmission lines at one part of the differential transmission path is smaller than the spacing between the first and second transmission lines at another part of the differential transmission path. Given that the thickness of the first conductor layer is fixed, the differential impedance of the one part of the differential transmission path having a small spacing between the first and second transmission lines is lower than the differential impedance of the another part of the differential transmission path having a large spacing between the first and second transmission lines. Therefore, when the thickness of the first conductor layer is fixed, the differential impedance of the above one part of the differential transmission path is lower than the differential impedance of the above another part of the differential transmission path.

On the other hand, the differential impedance is proportional to the square of inductance per unit length of the differential transmission path. By reducing the thickness of the part of the first conductor layer overlapping the above one part of the differential transmission path to less than the thickness of the another part of the first conductor layer overlapping the above another part of the transmission path, the inductance of the above one part of the differential transmission path can be increased. Accordingly, the differential impedance at the above one part of the differential transmission path can be increased. Therefore, continuity of the differential impedance can be ensured.

In addition, the spacing between the first and second transmission lines can be changed at different parts of the differential transmission path, while ensuring the continuity of the differential impedance. Therefore, the freedom of layout of the differential transmission path can be improved.

As such, it is possible to improve the freedom of layout of the differential transmission path, while ensuring the continuity of the differential impedance of the differential transmission path.

(2) The first insulating layer may have one surface and another surface, the differential transmission path may be formed on the one surface of the first insulating layer, and the first conductor layer may be formed on the another surface of the first insulating layer.

In this case, the first conductor layer can be used as a ground conductor layer. Accordingly, the transmission path can serve as a micro strip line. By reducing the thickness of a part of the ground conductor layer opposite to the above one part of the differential transmission path to less than the thickness of another part of the ground conductor layer opposite to the above another part of the differential transmission path, it is possible to ensure the continuity of the differential impedance.

(3) The printed circuit board may further include a second insulating layer formed on the one surface of the first insulating layer so as to cover the differential transmission path, and a second conductor layer formed on the second insulating layer so as to be opposite to the differential transmission path with the second insulating layer sandwiched therebetween. A thickness of a part of the second conductor layer overlapping the one part of the differential transmission path may be smaller than a thickness of another part of the second conductor layer overlapping the another part of the differential transmission path.

In this case, by reducing the thickness of the part of the second conductor layer opposite to the above one part of the differential transmission path to less than the thickness of the another part of the second conductor layer opposite to the above another part of the differential transmission path, the differential impedance of the above one part of the differential transmission path can be increased sufficiently. As a result, the continuity of the differential impedance can be ensured.

(4) The printed circuit board may further include a second insulating layer having one surface. The differential transmission path may be formed on the one surface of the second insulating layer, the first insulating layer may be formed on the one surface of the second insulating layer so as to cover the differential transmission path, and the first conductor layer may be formed on the first insulating layer so as to be opposite to the differential transmission path with the first insulating layer sandwiched therebetween.

In this case, the first conductor layer can be used as a shield layer to shut off the noise radiated from the differential transmission path. By reducing the thickness of a part of the shield layer opposite to the above one part of the differential transmission path to less than the thickness of another part of the shield layer opposite to the above another part of the differential transmission path, the continuity of the differential impedance can be ensured.

(5) The thickness of a part of the first conductor layer overlapping the one part of the differential transmission path may be smaller than a skin depth of the first conductor layer for a frequency of a signal transmitted through the differential transmission path.

When the first conductor layer is within the range of the skin depth of the first conductor layer for the frequency of the signal transmitted through the differential transmission path, a rate of change of the differential impedance relative to the thickness of the first conductor layer is increased. Thus, by reducing the thickness of the part of the first conductor layer overlapping the above one part of the differential transmission path to less than the skin depth of the first conductor layer for the frequency of the signal transmitted through the differential transmission path, an adjustable range of the differential impedance can be expanded. As a result, the continuity of the differential impedance can be ensured easily.

(6) A method of manufacturing a printed circuit board according to another aspect of the present invention includes the step of fabricating a stack of a first conductor layer, a first insulating layer, and a differential transmission path composed of first and second transmission lines, such that the first conductor layer is opposite to the differential transmission path with the first insulating layer sandwiched therebetween. The step of fabricating the stack includes forming the differential transmission path such that a spacing between the first and second transmission lines at a part of the differential transmission path is smaller than a spacing between the first and second transmission lines at another part of the differential transmission path, and forming the first conductor layer such that a thickness of a part of the first conductor layer overlapping the one part of the differential transmission path is smaller than a thickness of another part of the first conductor layer overlapping the another part of the differential transmission path.

In the method of manufacturing the printed circuit board, the differential transmission path is formed such that the spacing between the first and second transmission lines at the one part of the differential transmission path is smaller than the spacing between the first and second transmission lines at the another part of the differential transmission path.

Given that the thickness of the first conductor layer is fixed, the differential impedance of the one part of the differential transmission path having a small spacing between the first and second transmission lines is lower than the differential impedance of the another part of the differential transmission path having a large spacing between the first and second transmission lines. Therefore, when the thickness of the first conductor layer is fixed, the differential impedance of the above one part of the differential transmission path is lower than the differential impedance of the above another part of the differential transmission path.

On the other hand, the differential impedance is proportional to the square of inductance per unit length of the differential transmission path. The first conductor layer is formed such that the thickness of the part of the first conductor layer overlapping the above one part of the differential transmission path is smaller than the thickness of the another part of the first conductor layer overlapping the above another part of the differential transmission path. Accordingly, the differential impedance at the above one part of the differential transmission path can be increased. Therefore, continuity of the differential impedance can be ensured.

In addition, the spacing between the first and second transmission lines can be changed at different parts of the differential transmission path, while ensuring the continuity of the differential impedance. Therefore, the freedom of layout of the differential transmission path can be improved.

As such, it is possible to improve the freedom of layout of the differential transmission path, while ensuring the continuity of the differential impedance of the differential transmission path.

(7) The first insulating layer may have one surface and another surface. The step of forming the differential transmission path may include forming the differential transmission path on the one surface of the first insulating layer, and the step of forming the first conductor layer may include forming the first conductor layer on the another surface of the first insulating layer.

In this case, the first conductor layer can be used as a ground conductor layer. Accordingly, the differential transmission path serves as a micro strip line. By reducing the thickness of a part of the ground conductor layer opposite to the above part of the differential transmission path to less than the thickness of another part of the ground conductor layer opposite to the above another part of the differential transmission path, it is possible to ensure the continuity of the differential impedance.

(8) The method of manufacturing a printed circuit board may further include the steps of forming a second insulating layer on the one surface of the first insulating layer so as to cover the differential transmission path, and forming a second conductor layer on the second insulating layer such that the second conductor layer is opposite to the differential transmission path with the second insulating layer sandwiched therebetween. The step of forming the second conductor layer may include forming the second conductor layer such that a thickness of a part of the second conductor layer overlapping the one part of the differential transmission path is smaller than a thickness of another part of the second conductor layer overlapping the another part of the differential transmission path.

In this case, by reducing the thickness of the part of the second conductor layer opposite to the above one part of the differential transmission path to less than the thickness of the another part of the second conductor layer opposite to the above another part of the differential transmission path, the differential impedance of the above one part of the differential transmission path can be increased sufficiently. As a result, the continuity of the differential impedance can be ensured.

(9) The step of fabricating the stack may further include forming the first insulating layer, the step of forming the differential transmission path may include forming the differential transmission path on one surface of the second insulating layer having the one surface, the step of forming the first insulating layer may include forming the first insulating layer on the one surface of the second insulating layer so as to cover the differential transmission path, and the step of forming the first conductor layer may include forming the first conductor layer on the first insulating layer such that the first conductor layer is opposite to the differential transmission path with the first insulating layer sandwiched therebetween.

In this case, the first conductor layer can be used as a shield layer to shut off the noise radiated from the differential transmission path. By reducing the thickness of a part of the shield layer opposite to the above one part of the differential transmission path to less than the thickness of another part of the shield layer opposite to the above another part of the differential transmission path, the continuity of the differential impedance can be ensured.

(10) The step of forming the first conductor layer may include making the thickness of a part of the first conductor layer overlapping the one part of the differential transmission path smaller than a skin depth of the first conductor layer for a frequency of a signal transmitted through the differential transmission path.

When the first conductor layer is within the range of the skin depth of the first conductor layer for the frequency of the signal transmitted through the differential transmission path, a rate of change of the differential impedance relative to the thickness of the first conductor layer is increased. Thus, by reducing the thickness of the part of the first conductor layer overlapping the above one part of the differential transmission path to less than the skin depth of the first conductor layer for the frequency of the signal transmitted through the differential transmission path, an adjustable range of the differential impedance can be expanded. As a result, the continuity of the differential impedance can be ensured easily.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIG. 5 is a graph showing the results of a first simulation;

FIG. 9 is a graph showing the results of a fourth simulation;

FIGS. 15(a) and (b) are schematic sectional views showing an FPC board according to a seventh embodiment.

DESCRIPTION OF THE PREFERRED EMBODIMENTS

Description will be made of a printed circuit board and a method of manufacturing the same according to embodiments of the present invention with reference to the drawings. In the following, the configuration and manufacturing method of a flexible printed circuit board having flexibility (hereinafter referred to as an FPC board) will be described as a printed circuit board according to the embodiments of the present invention.

[1] First Embodiment (1) Configuration of the FPC Board

Figure 1:
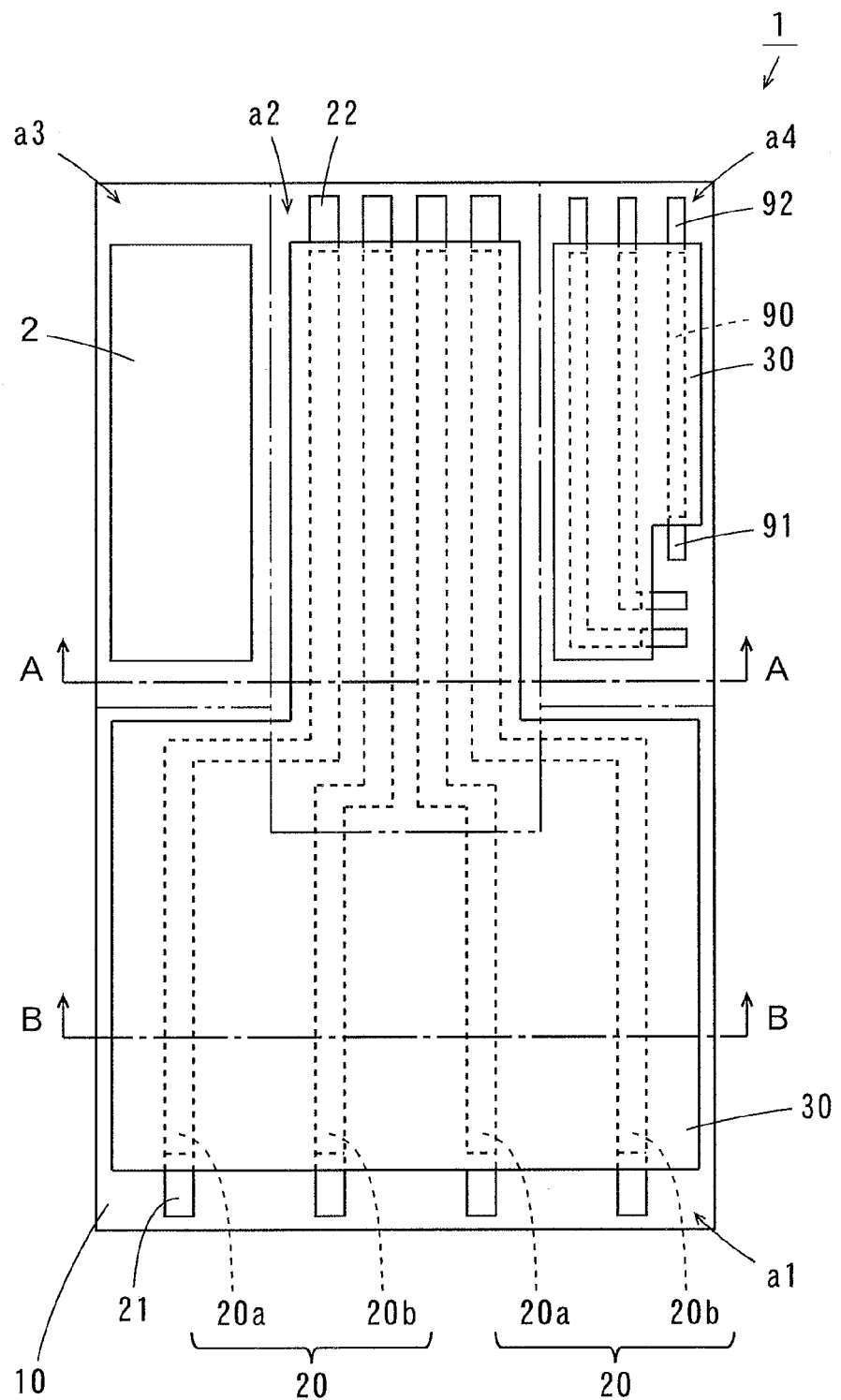
FIG. 1 is a schematic plan view of an FPC board according to a first embodiment of the present invention.

FIG. 1 is a schematic plan view of an FPC board according to a first embodiment of the present invention. FIG. 2(a) is a sectional view taken along the line A-A of FIG. 1, and FIG. 2(b) is a sectional view taken along the line B-B of FIG. 1. As shown in FIGS. 1 and 2(a), (b), an FPC board 1 mainly includes a base insulating layer 10, two differential transmission paths 20, a cover insulating layer 30, and a ground conductor layer 40.

First, second, third and fourth areas a1, a2, a3, a4 are provided on an upper surface of the base insulating layer 10. Two differential transmission paths 20 are formed to extend from the first area a1 to the second area a2. Each differential transmission path 20 is used to transmit differential signals, and composed of a pair of transmission lines 20a, 20b. Two differential transmission paths 20 are arranged adjacent to each other.

In a longitudinal direction of the two differential transmission paths 20, a width of the second area a2 is smaller than a width of the first area a1. The second, third and fourth areas a2, a3, a4 are provided side by side in a direction perpendicular to the longitudinal direction of the two differential transmission paths 20. The second area a2 is located between the third and fourth areas a3, a4.

Connections pads 21, 22 are provided, each on one end and the other end of the transmission line 20a, 20b, respectively. A pair of transmission lines 20a, 20b is arranged so that the transmission lines are adjacent to each other and spaced apart from each other from one end to the other end thereof. The cover insulating layer 30 is provided on the first and second areas a1, a2 of the base insulating layer 10 so as to cover the pair of transmission lines 20a, 20b except the connecting pads 21, 22. Terminals of electronic equipments or the like are connected to the connecting pads 21, 22 of each transmission line 20a, 20b.

An electronic component 2 is mounted on the third area a3 of the base insulating layer 10. On the fourth area a4 of the base insulating layer 10, three transmission lines 90 are formed in a predetermined pattern. Connecting pads 91, 92 are formed on one end and the other end of each transmission line 90, respectively. Further, the cover insulating layer 30 is provided on the fourth area a4 of the base insulating layer 10 so as to cover the transmission lines 90 except the connecting pads 91, 92. Terminals of electronic equipments or the like are connected to the connecting pads 91, 92 of each transmission line 90.

The ground conductor layer 40 is formed on a lower surface of the base insulating layer 10. Thus, the ground conductor layer 40 is opposite to the differential transmission paths 20 with the base insulating layer 10 sandwiched therebetween. The ground conductor layer 40 includes a second conductor layer 41 and a metal thin film 42.

On the upper surface of the base insulating layer 10, the third area a3 is provided to secure the area for mounting the electronic component 2, and the fourth area a4 is provided to secure the area where the transmission paths 90, other than the differential transmission paths 20, are formed. In the second area a2 provided between the third and fourth areas a3 and a4, the area for forming the differential transmission paths 20 is limited.

In view of the above, a spacing S between the pair of transmission lines 20a, 20b in an arbitrary cross section of the FPC board 1 perpendicular to the pair of transmission lines 20a, 20b on the second area a2 is set smaller than a spacing S between the pair of transmission lines 20a, 20b in an arbitrary cross section of the FPC board 1 perpendicular to the pair of transmission lines 20a, 20b on the first area a1.

As shown in first simulation results which will be described later, in an arbitrary cross section of the FPC board 1 perpendicular to the pair of transmission lines 20a, 20b, given that the thickness of the ground conductor layer 40 that overlaps the first to fourth areas a1 to a4 is fixed, when the spacing S between the pair of transmission lines 20a, 20b is smaller, differential impedance of a part of the differential transmission paths 20 having small spacing S is decreased. In this case, it is preferable to adjust widths W1, W2 of the transmission lines 20a, 20b, respectively, to ensure the continuity of differential impedance of the differential transmission paths 20.

In this embodiment, the spacing S between the pair of transmission lines 20a, 20b on the second area a2 is smaller than the spacing S of the transmission lines 20a, 20b on the first area a1. Therefore, if the widths W1, W2 of the transmission lines 20a, 20b on the second area a2 are equal to the widths W1, W2 of the transmission lines 20a, 20b on the first area a1, the differential impedance in the second area a2 is decreased.

According to the first simulation results as described below, it is possible to increase the differential impedance in the second area a2 by reducing the widths W1, W2 of the transmission lines 20a, 20b, respectively. It is noted, however, that there is a limit to measurements of the transmission paths 20a, 20b that can be formed within a certain error range. Namely, there is a lower limit to the widths W1 and W2 of the transmission lines 10b and 20b. As such, if reducing the widths W1 and W2 of the transmission lines 20a, 20b is impossible, the differential impedance in the second area a2 cannot be increased. Thus, the continuity of the differential impedance cannot be ensured.

According to second and third simulation results described below, adjusting the differential impedance of the differential transmission path 20 is also possible by changing the thickness of the ground conductor layer 40, even when the widths W1 and W2 of the transmission lines 20a and 20b, and the spacing S between the pair of transmission lines 20a and 20b are fixed.

In view of this, in this embodiment, a thickness t42 of the ground conductor layer 40 overlapping the second area a2 is set smaller than a thickness t40 of the ground conductor layer 40 overlapping the first, third and fourth areas a1, a3, a4. Thus, the differential impedance of the differential transmission paths 20 in the second area a2 can be adjusted so that it coincides with the differential impedance of the differential transmission paths 20 in the first area a1. As a result, the continuity of the differential impedance of the differential transmission paths 20 can be ensured. Also, when the thickness t42 of the ground conductor layer 40 is sufficiently small within the range of skin depth of the ground conductor layer 40 for the frequency of digital signals transmitted through the differential transmission paths 20, a rate of change of the differential impedance relative to the thickness t42 of the ground conductor layer 40 is increased. Therefore, it is preferable to set the thickness t42 of the ground conductor layer 40 in the second area a2 smaller than the skin depth of the ground conductor layer 40 for the frequency of digital signals transmitted through the differential transmission paths 20 in the FPC board 1 shown in FIGS. 1 and 2. This leads to expand the adjustable range of the differential impedance. As a result, the continuity of the differential impedance can be easily ensured.

As described above, it is possible to make the spacing S between the transmission lines 20a, 20b in the first area a1 and the spacing S between the transmission lines 20a, 20b in the second area a2 different from each other, while ensuring the continuity of the differential impedance. Thus, the freedom of layout of the differential transmission paths 20 can be improved, while ensuring the continuity of the differential impedance of the differential transmission paths 20. In addition, the freedom of layout of an area for mounting the electronic component 2 and three transmission lines 90 on the base insulating layer 10 can also be improved.

(2) The Method of Manufacturing the FPC Board 1

Figure 2:
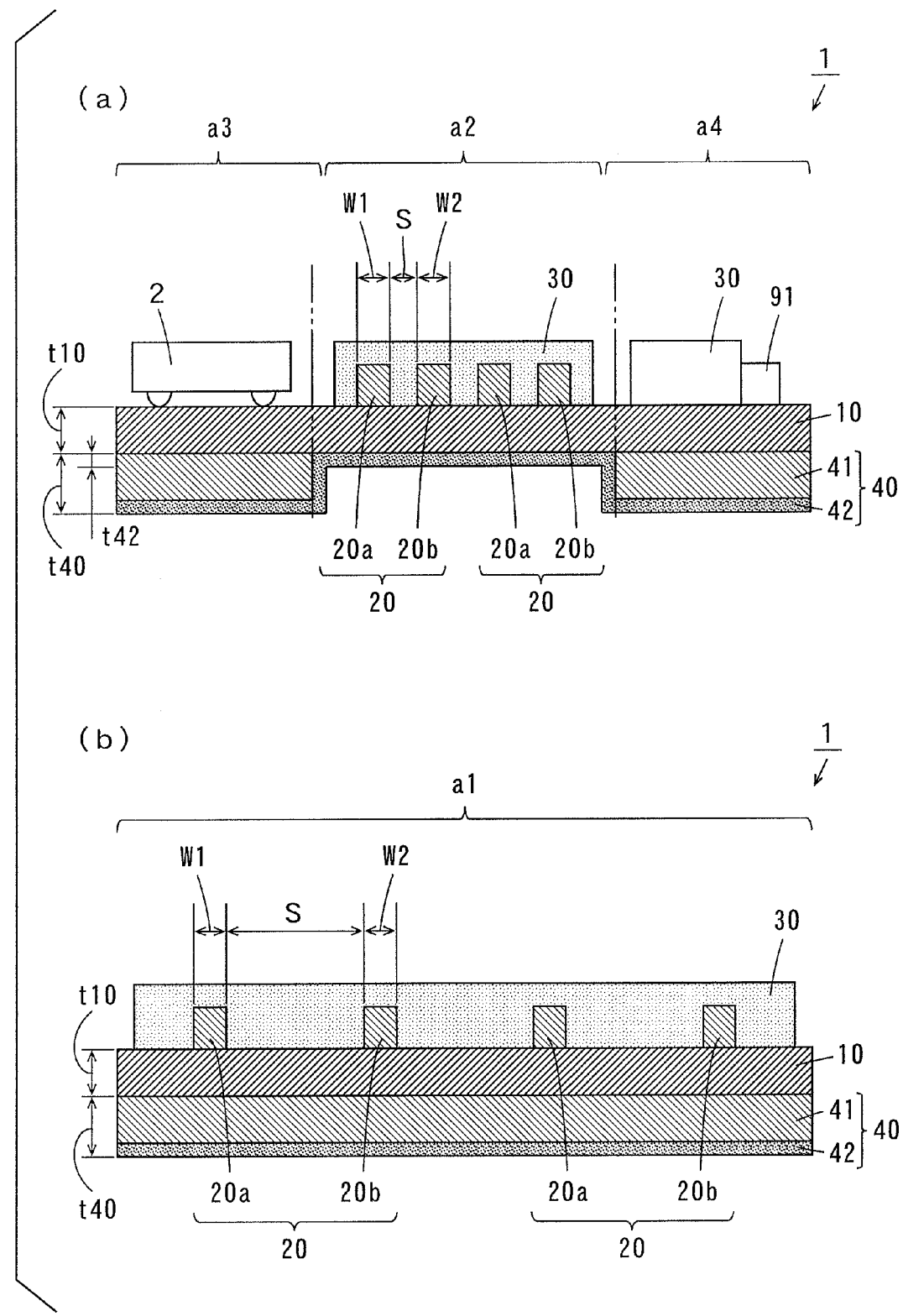
FIG. 2(a) is a sectional view taken along the line A-A of FIG. 1.
FIG. 2(b) is a sectional view taken along the line B-B of FIG. 1.
Figure 3:
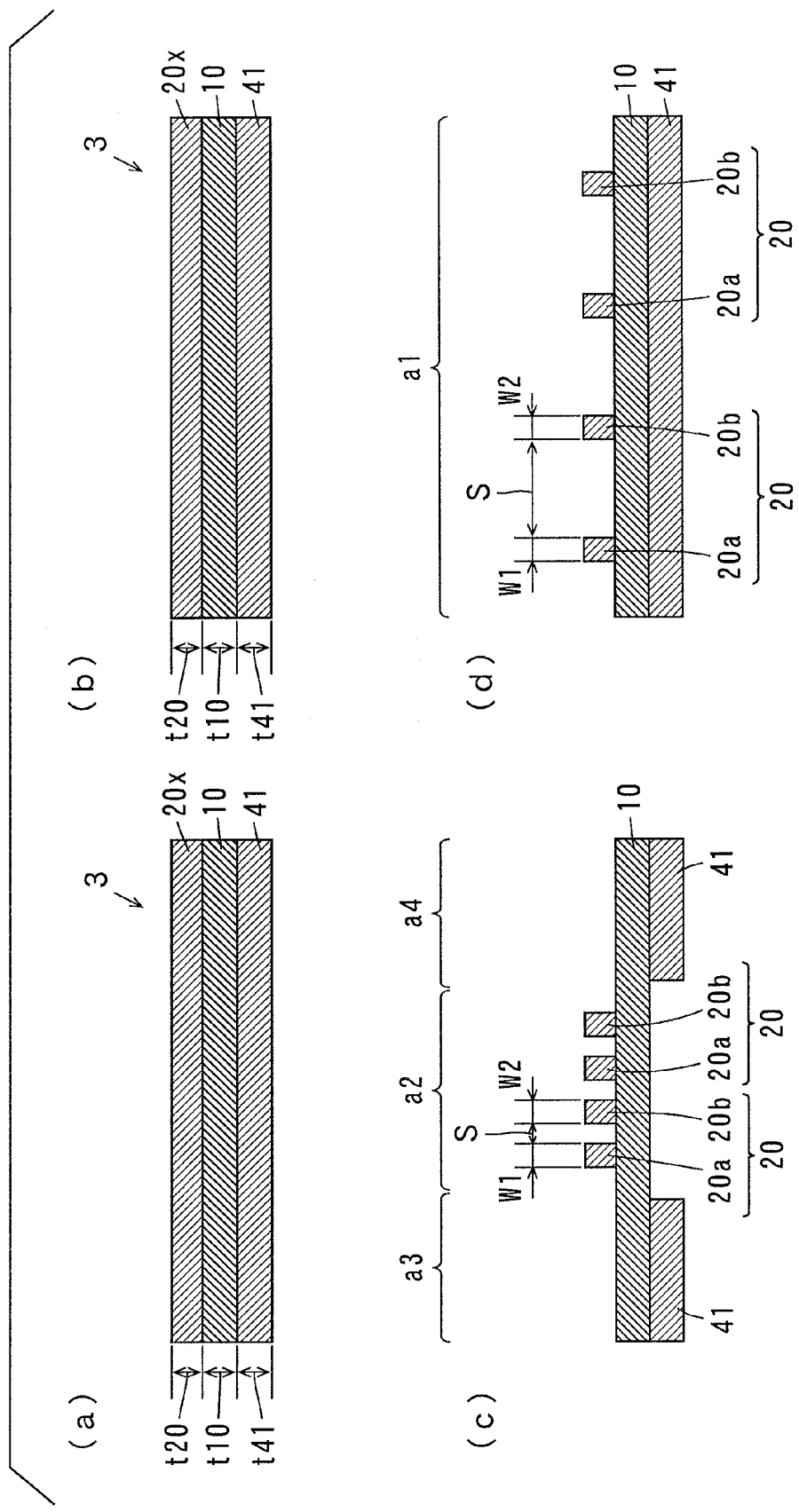
FIGS. 3(a) to (d) are schematic sectional views of process steps showing an example of a method of manufacturing the FPC board of FIGS. 1 and 2.
Figure 4:
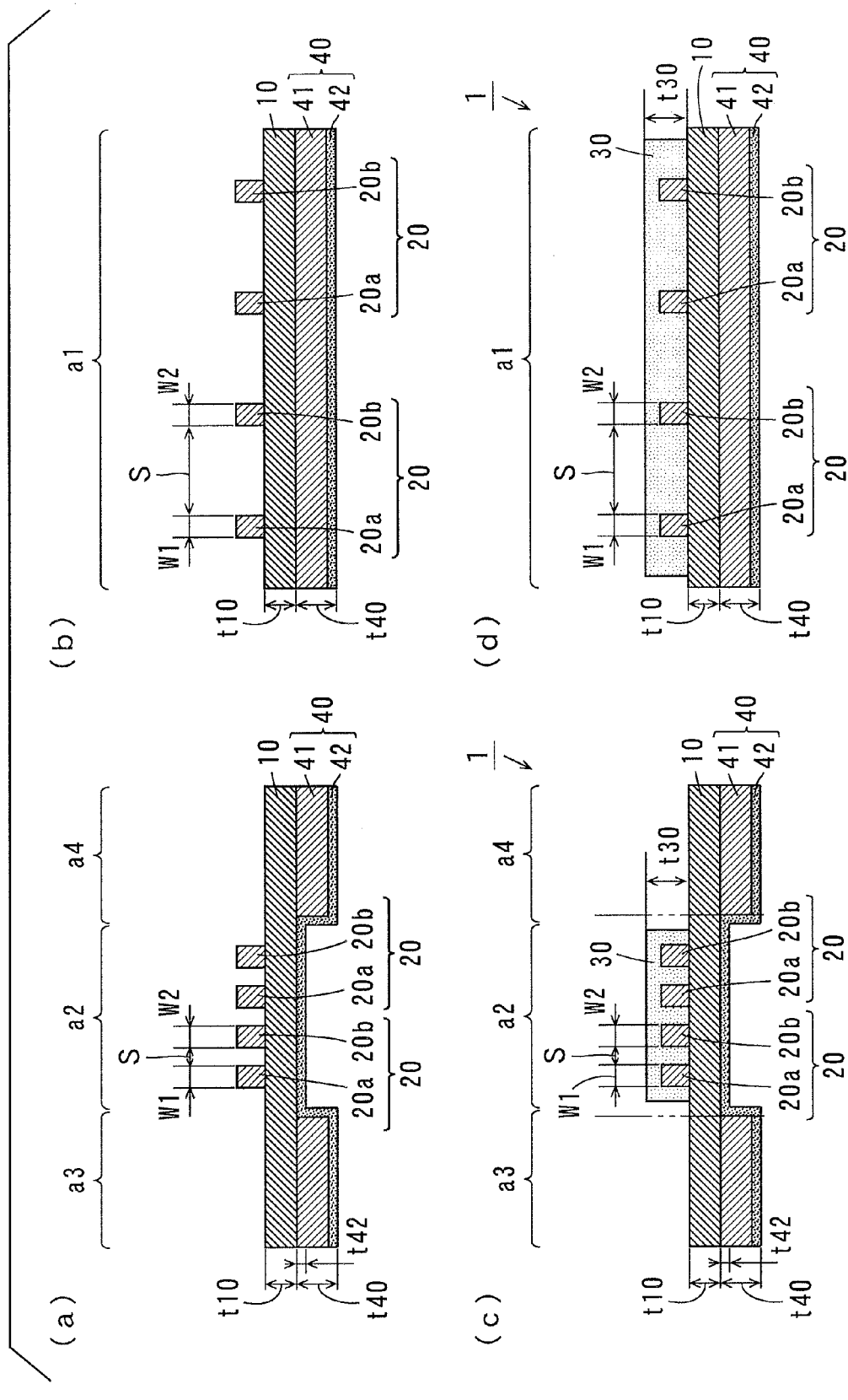
FIGS. 4(a) to (d) are schematic sectional views of process steps showing an example of a method of manufacturing the FPC board of FIGS. 1 and 2.

FIGS. 3 and 4 are schematic sectional views of process steps for showing an example of a method of manufacturing the FPC board 1 of FIGS. 1 and 2. The FPC board 1 of FIGS. 1 and 2 is formed using a subtractive method, for example.

FIGS. 3(a), (c) and FIGS. 4(a), (c) are sectional views corresponding to the cross sections taken along the line A-A of FIG. 1. FIGS. 3(b), (d) and FIGS. 4(b), (d) are sectional views corresponding to the cross section taken along the line B-B of FIG. 1. It is noted that the electronic component 2 mounted in the third area a3 and three transmission lines 90 formed in the fourth area a4 of FIG. 1 will not be described. Therefore, the electronic component 2 and the transmission lines 90 of FIG. 1 are not shown in FIGS. 3 and 4.

First, a three-layer base material 3 is prepared as shown in FIGS. 3(a), (b). The three-layer base material 3 includes a base insulating layer 10 with a first conductor layer 20x being provided on the upper side thereof and a second conductor layer 41 being provided on the lower side thereof.

The base insulating layer 10 is made of polyimide, and the first conductor layer 20x and the second conductor layer 41 are made of copper. A thickness t10 of the base insulating layer 10 is not less than 5 μm and not more than 50 μm, and preferably not less than 10 μm and not more than 25 μm, for example. A thickness t20 of the first conductor layer 20x is not less than 3 μm and not more than 40 μm, and preferably not less than 8 μm and not more than 25 μm, for example. Similarly, a thickness t41 of the second conductor layer 41 is not less than 3 μm and not more than 40 μm, and preferably not less than 8 μm and not more than 25 μm, for example.

Next, as shown in FIGS. 3(c), (d), the first conductor layer 20x is patterned by normal steps of photoresist formation, exposure, development and etching, whereby two differential transmission paths 20 are formed on the upper surface of the base insulating layer 10. Each differential transmission path 20 includes a pair of transmission lines 20a, 20b arranged adjacent to each other.

Similarly, the second conductor layer 41 is also patterned by the normal steps of photoresist formation, exposure, development and etching. In this embodiment, a part of the second conductor layer 41 overlapping the second area a2 of the base insulating layer 10 in a direction perpendicular to the base insulating layer 10 is removed.

Widths W1, W2 of the pair of transmission lines 20a, 20b are not less than 10 μm and not more than 100 μm, and preferably not less than 10 μm and not more than 75 μm, for example. In this embodiment, the width W1 of the transmission line 20a remains the same in the first and second areas a1, a2. Also, the width W2 of the transmission line 20b remains the same in the first and second areas, a1, a2. A spacing S between the pair of transmission lines 20a, 20b is not less than 20 μm and not more than 200 μm, and preferably not less than 20 μm and not more than 100 μm. In this embodiment, the spacing S between the pair of transmission lines 20a, 20b in the first area a1 is larger than in the second area a2.

It is noted that, in the FPC board 1 of FIGS. 1 and 2, three transmission lines 90 in the fourth area a4 are formed on the base insulating layer 10 together with the differential transmission paths 20 by pattering the first conductor layer 20x during the above step of forming the differential transmission paths 20.

Subsequently, as shown in FIGS. 4(a),(b), a metal thin film 42 is formed by a common method such as sputtering, vapor deposition, or electroless plating, to cover the lower surface of the base insulating layer 10, the lower surface of the second conductor layer 41, and the side face of the second conductor layer 41 formed by patterning. Thus, the ground conductor layer 40 consisting of the second conductor layer 41 and the metal thin film 42 is formed on the lower surface of the base insulating layer 10.

The metal thin film 42 is a copper thin film. A thickness t42 of the metal thin film 42 is not less than 0.08 μm and not more than 1 μm, and preferably not less than 0.1 μm and not more than 0.5 μm, for example.

Next, as shown in FIGS. 4(c), (d), a cover insulating layer 30 made of polyimide is formed on the upper surface of the base insulating layer 10. A thickness t30 of the cover insulating layer 30 is not less than 5 μm and not more than 50 μm, and preferably not less than 10 μm and not more than 25 μm, for example.

In this manner, the FPC board 1 is completed. Instead of polyimide, another insulating material such as epoxy may be used as the material of the base insulating layer 10 and the cover insulating layer 30.

Instead of copper, another material such as gold, nickel or aluminum, or an alloy such as a copper alloy or an aluminum alloy may be used as the material for the first conductor layer 20x, the second conductor layer 41, and the metal thin film 42. The second conductor layer 41 and the metal thin film 42 form the ground conductor layer 40.

As described above, while the three-layer base material 3 is used in this embodiment to form the differential transmission paths 20 on the upper surface of the base insulating layer 10 and the ground conductor layer 40 on the lower surface of the base insulating layer 10, the method of forming the differential transmission paths 20 and the ground conductor layer 40 is not limited to this. For example, a one-layer base insulating layer 10 may be prepared as a base material, and conductor layers are formed on both upper and lower surfaces thereof, which is then patterned to form the differential transmission paths 20 and the ground conductor layer 40.

In this embodiment, the differential transmission paths 20 and the ground conductor layer 40 are formed on the upper and lower surfaces of the base insulating layer 10 by the subtractive method. Alternatively, the differential transmission paths 20 and the ground conductor layer 40 may be formed using another method such as a semi-additive method or an additive method.

In the FPC board 1 of FIG. 1, the electronic component 2 is provided in the third area a3, but another ground conductor layer may be provided in the third area a3 instead of the electronic component 2.

(3) Relationship Between Dimensions of the Components and Transmission Characteristics of the Differential Transmission Path (3-1) First Simulation Here, a relationship between the widths W1, W2 of the transmission lines 20a, 20b and differential impedance Zdiff for several types of FPC boards 1 having different spacings S between the transmission lines 20a, 20b is obtained by a first simulation.

Specifically, a relationship between the widths W1, W2 of the transmission lines 20a, 20b and the differential impedance Zdiff is determined for each of four types of FPC boards 1 having different spacing S of 40 μm, 50 μm, 75 μm and 100 μm between the transmission lines 20a, 20b. The setting of the widths W1, W2 of the transmission lines 20a, 20b is from 10 μm to 100 μm. The thickness t40 of the ground conductor layer 40 is fixed at 13 μm.

In the first simulation, the widths W1, W2 of the transmission lines 20a, 20b are set the same and constant from one end to the other end of each transmission line. The spacing S between the pair of the transmission lines 20a, 20b is also set the same and constant from one end to the other end of each transmission line. In addition, the setting of the thickness t40 of the ground conductor layer 40 opposite to the transmission lines 20a, 20b with the base insulating layer 10 sandwiched therebetween is fixed. The thickness t20 of the transmission lines 20a, 20b is 13 μm, and the thickness t10 of the base insulating layer 10 is 25 μm. The thickness t30 of the cover insulating layer 30 is 28 μm.

FIG. 5 is a graph showing the results of the first simulation. In FIG. 5, the vertical axis indicates the differential impedance Zdiff of the differential transmission path 20, and the horizontal axis indicates the widths W1, W2 of the transmission lines 20a, 20b.

As shown in FIG. 5, when the spacing S between the transmission lines 20a, 20b is 40 μm, the differential impedance Zdiff is increased as the widths W1, W2 of the differential transmission lines are smaller, while the differential impedance Zdiff is decreased as the widths W1, W2 of the transmission lines 20a, 20b are larger.

Similarly, when the spacing S of the transmission lines 20a, 20b is 50 μm, 75 μm or 100 μm, the differential impedance Zdiff is increased as the widths W1, W2 of the transmission lines 20a, 20b are smaller, and the differential impedance Zdiff is decreased as the widths W1, W2 of the transmission lines 20a, 20b are larger.

In contrast, when the widths W1, W2 of the transmission lines 20a, 20b are fixed, the differential impedance Zdiff is decreased as the spacing S between the transmission lines 20a, 20b is smaller, and the differential impedance Zdiff is increased as the spacing S between the transmission lines 20a, 20b is larger.

Therefore, it is found that when the widths W1, W2 of the transmission lines 20a, 20b are fixed and the spacing S between the transmission lines 20a and 20b is partially smaller in the longitudinal direction of the transmission lines 20a, 20b, the differential impedance Zdiff of a part of the differential transmission path 20 having a small spacing S between the transmission lines 20a, 20b is lower than the differential impedance Zdiff of other parts of the differential transmission path 20.

In this case, it may be possible to reduce the widths W1, W2 of the part of the transmission lines 20a, 20b having small spacing S between the transmission lines 20a, 20b. Accordingly, the differential impedance Zdiff of the part of the transmission lines 20a, 20b having the small distance S between the transmission lines 20a, 20b is increased, whereby the continuity of the differential transmission path Zdiff in the longitudinal direction of the transmission lines 20a, 20b can be ensured. However, since there is a lower limit to the widths W1, W2 of the transmission lines 20a and 20b, respectively, it might be difficult to ensure the continuity of the differential impedance Zdiff when the widths W1, W2 of the differential transmission lines 20a and 20b cannot be reduced.

(3-2) Second Simulation

When the digital signal transmitted through the differential transmission path 20 have high frequency (e.g., over 100 MHz), the differential impedance Zdiff of the differential transmission path 20 is approximated using the following equation (1):

$$Zdiff = \sqrt{(L/C)} \quad (1)$$

In the equation (1), L represents inductance per unit length of the differential transmission path 20, and C represents capacitance per unit length of the differential transmission path 20.

Here, a relationship between the differential impedance Zdiff of the differential transmission path 20 and the frequency of digital signals transmitted through the differential transmission path 20 is determined by a second simulation.

Specifically, for each of three types of FPC boards 1 in which the spacing S between the transmission lines 20a, 20b is 50 μm, 75 μm, or 100 μm, the thickness t40 of the ground conductor layer 40 is fixed at 10 μm, and the widths W1, W2 of the transmission lines 20a, 20b are also fixed at 50 μm, a relationship between the differential impedance Zdiff and the frequency of the digital signal is determined. Similarly, for each of three types of FPC boards 1 in which the spacing S between the transmission lines 20a, 20b is 50 μm, 75 μm, or 100 mμ, the thickness t40 of the conductor layer 40 is fixed at 0.1 μm, and the widths W1, W2 of the transmission lines 20a, 20b are fixed at 50 μm, a relationship between the differential impedance Zdiff and the frequency of the digital signals is determined. A range of the frequency of the digital signals is set from about 30 MHz to 1 GHz.

In the second simulation, the widths W1, W2 of the transmission lines 20a, 20b are the same and constant from one end to the other end of each line. Also, the spacing S between the pair of transmission lines 20a, 20b are the same and constant from one end to the other end of each line. Further, the thickness t40 of the conductor layer 40 opposite to the transmission lines 20a, 20b with the base insulating layer 10 sandwiched therebetween is set constant. The thickness t20 of the transmission lines 20a, 20b is 13 μm, and the thickness t10 of the base insulating layer 10 is 25 μm. The thickness t30 of the cover insulating layer 30 is 28 μm.

Figure 6:
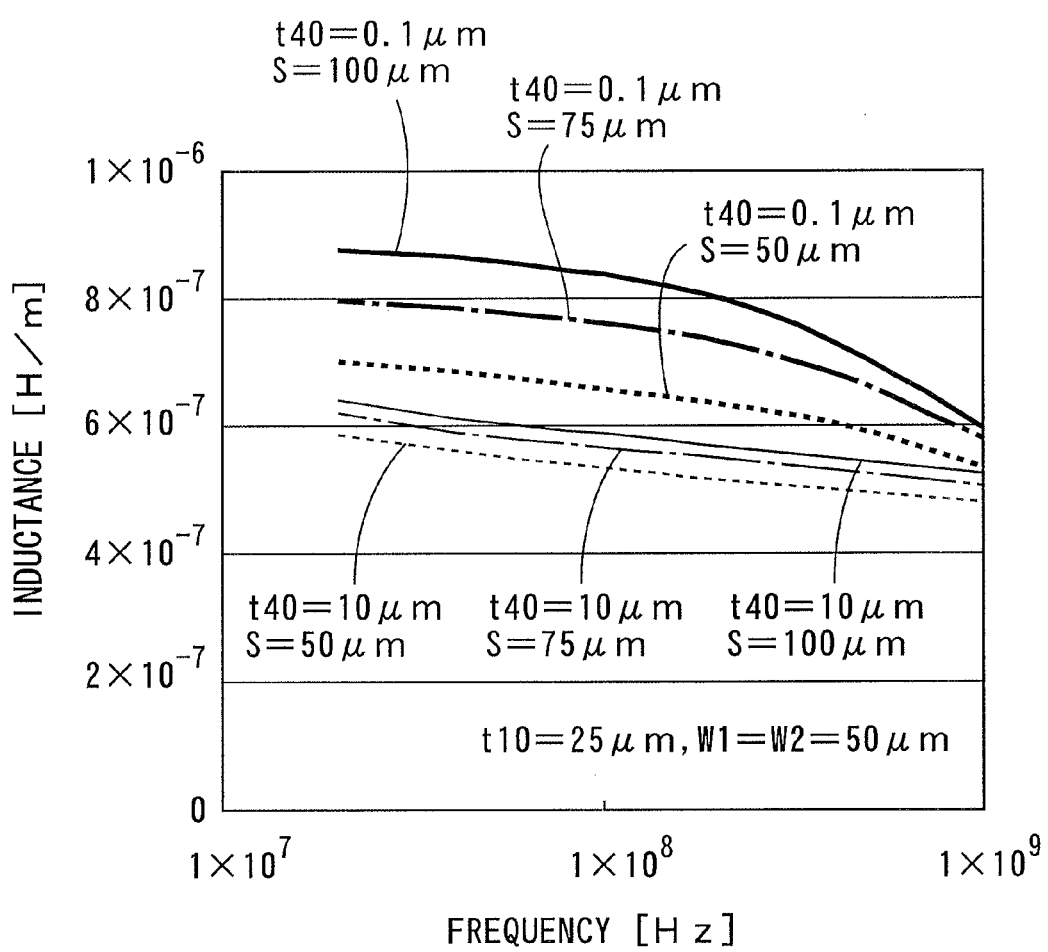
FIG. 6 is a graph showing the results of a second simulation.

FIG. 6 is a graph showing the results of the second simulation. In FIG. 6, the vertical axis indicates inductance L of the differential transmission path 20, and the horizontal axis indicates the frequency of digital signals transmitted through the differential transmission path 20.

As shown in FIG. 6, it is found that when the thickness t40 of the ground conductor layer is 10 μm, and the frequency of a digital signal is within the range from about 30 MHz to 1 GHz, the inductance L is increased as the spacing S between the transmission lines 20a, 20b is larger, while the inductance L is decreased as the spacing S between the transmission lines 20a, 20b is smaller.

Similarly, it is found that when the thickness t40 of the ground conductor layer 40 is 0.1 μm, and the frequency of the digital signal is within the range from about 30 MHz to 1 GHz, the inductance L is increased as the spacing S between the transmission lines 20a, 20b is larger, while the inductance L is decreased as the spacing S between the transmission lines 20a, 20b is smaller.

Further, when the spacing S between the transmission lines 20a, 20b is 50 μm, and the frequency of the digital signal is within the range from about 30 MHz to 1 GHz, the inductance L at the thickness t40 of the ground conductor layer 40 of 0.1 μm is higher than the inductance L at the thickness t40 of the ground conductor layer 40 of 10 μm.

Similarly, when the spacing S of the transmission lines 20a, 20b is 75 μm and 100 μm, and the frequency of the digital signal is within the range from about 30 MHz to 1 GHz, the inductance L at the thickness t40 of the ground conductor layer 40 of 0.1 μm is higher than the inductance L at the thickness t40 of the ground conductor layer 40 of 10 μm.

According to the results of the second simulation, it is found that as long as the frequency of the digital signal is within the range from about 30 MHz to 1 GHz, the inductance L of the differential transmission path 20 can be controlled by changing the thickness t40 of the ground conductor layer 40. As such, by changing the thickness t40 of the ground conductor layer 40 using the above equation (1), it is found that the differential impedance Zdiff of the differential transmission path 20 can be controlled.

Here, it is noted that when the thickness t40 of the ground conductor layer 40 is larger than a skin depth of the ground conductor layer 40 for the frequency of the digital signal transmitted through the differential transmission path 20, it is likely that a sufficiently large amount of eddy current is generated in the ground conductor layer 40 during the transmission of the digital signal through the differential transmission path 20. Therefore, a rate of change of the differential impedance Zdiff relative to the thickness t40 of the ground conductor layer 40 is decreased within the range of the skin depth of the ground conductor layer 40 for the frequency of the digital signal.

On the other hand, as the thickness t40 of the ground conductor layer 40 is smaller than the skin depth of the ground conductor layer 40, the eddy current occurring in the ground conductor layer 40 during the transmission of digital signal through the differential transmission path 20 is decreased. Therefore, a rate of change of the differential impedance Zdiff relative to the thickness t40 of the ground conductor layer 40 is increased as the thickness t40 of the ground conductor layer 40 is smaller than the skin depth of the ground conductor layer 40 for the frequency of the digital signal.

From the above, it is preferable to make the thickness t40 of the ground conductor layer 40 sufficiently smaller than the skin depth of the ground conductor layer 40 for the frequency of the digital signal. Thus, an adjustable range of the differential impedance Zdiff can be expanded. As a result, the continuity of the differential impedance Zdiff can be easily ensured.

For example, when the differential transmission path 20 is made of copper and the frequency of the digital signal transmitted through the differential transmission path 20 is 1 GHz, the skin depth of the ground conductor layer 40 is 2.09 μm. If it is desired to transmit the digital signal having the frequency of not more than 1 GHz through the differential transmission path 20, the thickness t42 of the ground conductor layer 40 in the second area a2 of FIG. 1 is preferably set in a range from over 0 μm to sufficiently smaller than 2.09 μm.

(3-3) Third Simulation

A relationship between the differential impedance Zdiff of the differential transmission path 20 and the thickness t40 of the ground conductor layer 40 is obtained from a third simulation.

Specifically, a relationship between the differential impedance Zdiff and the thickness t40 of the ground conductor layer 40 is determined for each of three types of FPC boards 1 in which the spacing S between the transmission lines 20a, 20b is 50 μm, 75 μm or 100 μm, and the widths W1, W2 of the transmission lines 20a, 20b is fixed at 50 μm. The thickness t40 of the ground conductor layer 40 is set from 0.1 μm to 10 μm. In this embodiment, since the frequency of digital signal transmitted through the differential transmission path 20 is 1 GHz, the skin depth of the ground conductor layer 40 is 2.09 μm.

In the third simulation, the widths W1, W2 of the transmission path 20 are the same and constant from one end to the other end of each line. Also, the spacing S between the pair of transmission lines 20a, 20b is the same and constant from one end to the other end of each line. Further, the thickness t40 of the ground conductor layer 40 opposite to the transmission lines 20a, 20b with the base insulating layer 10 sandwiched therebetween is fixed. The thickness t20 of the transmission lines 20a, 20b is 13 μm, and the thickness t10 of the base insulating layer 10 is 25 μm. The thickness t30 of the cover insulating layer 30 is 28 μm.

Figure 7:
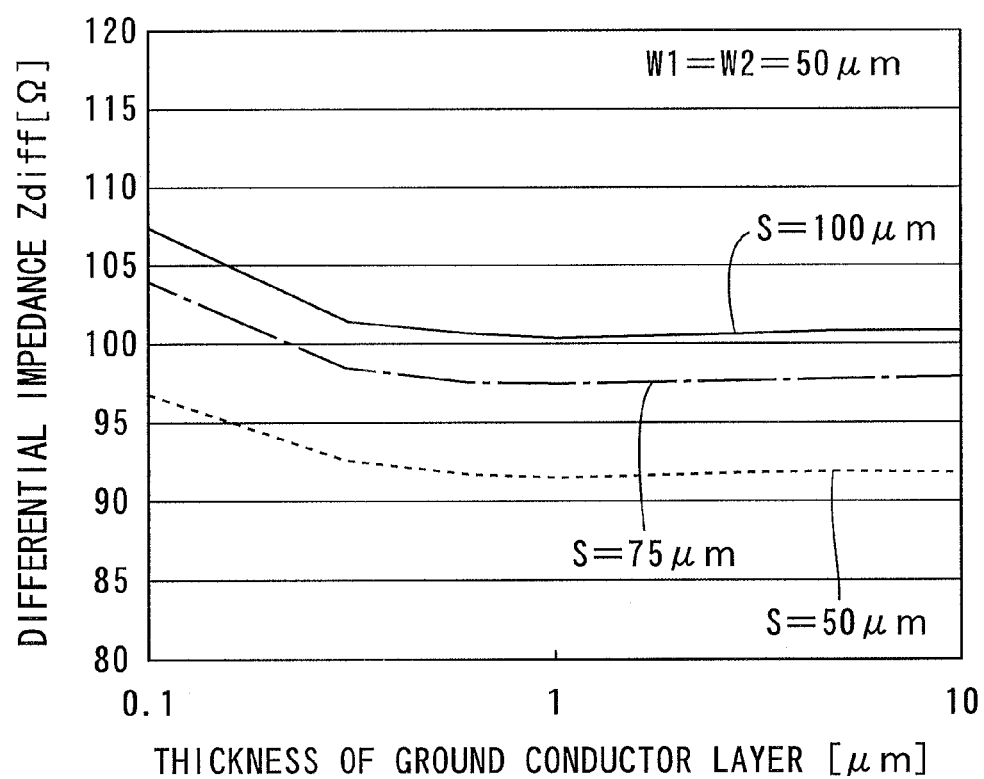
FIG. 7 is a graph showing the results of a third simulation.

FIG. 7 shows the results of the third simulation. In FIG. 7, the vertical axis indicates the differential impedance Zdiff of the differential transmission path 20, and the horizontal axis indicates the thickness t40 of the ground conductor layer 40.

As shown in FIG. 7, when the spacing S between the transmission lines 20a, 20b is 50 μm, the differential impedance Zdiff of the differential transmission path 20 is made smaller as the thickness t40 of the ground conductor layer 40 approaches 1 μm from 0.1 μm. When the thickness t40 of the ground conductor layer 40 is within the range from 1 μm to 10 μm, the differential impedance Zdiff of the differential transmission path 20 is substantially constant.

Similarly, when the spacing S between the transmission lines 20a, 20b is 75 μm and 100 μm, the differential impedance Zdiff of the differential transmission path 20 is made smaller as the thickness t40 of the ground conductor layer 40 approaches 1 μm from 0.1 μm. When the thickness t40 of the ground conductor layer 40 is within the range from 1 μm to 10 μm, the differential impedance Zdiff of the differential transmission path 20 is substantially constant.

Accordingly, it becomes apparent that, when the spacing S between the transmission lines 20a, 20b is fixed, the differential impedance Zdiff of the differential transmission path 20 can be sufficiently controlled by adjusting the thickness t40 of the ground conductor layer 40 within the range from 0.1 μm to 1 μm, which is below the skin depth (2.09 μm) of the ground conductor layer 40.

[2] Second Embodiment (1) Configuration of the FPC Board

The configuration of an FPC board according to a second embodiment will be described below in terms of differences from the FPC board 1 according to the first embodiment.

Figure 8:
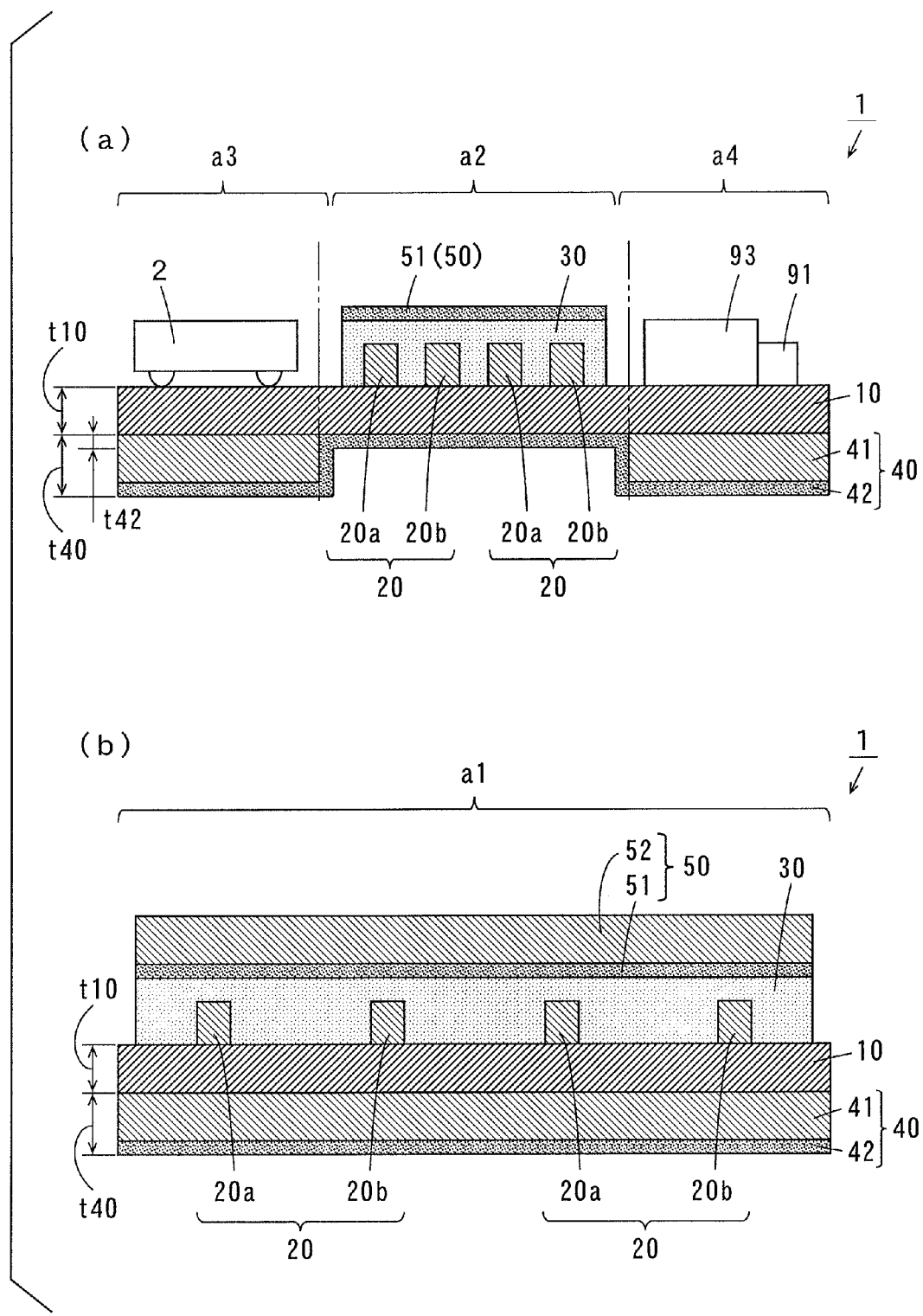
FIGS. 8(a) and (b) are sectional views showing the configuration of an FPC board according to a second embodiment.

FIG. 8 show sectional views illustrating the configuration of the FPC board according to the second embodiment. FIG. 8(a) is a sectional view corresponding to the cross section taken along the line A-A of FIG. 1, and FIG. 8(b) is a sectional view corresponding to the cross section taken along the line B-B of FIG. 1.

As shown in FIGS. 8(a), (b), the FPC board 1 according to the second embodiment includes a shield layer disposed on the upper surface of the cover insulating layer 30 of FIG. 1 to shut off high frequency noise radiated from the differential transmission paths 20.

As shown in FIGS. 8(a), (b), the shield layer 50 is opposite to the differential transmission paths 20 with the cover insulating layer 30 sandwiched therebetween. The shield layer 50 includes a metal thin film 51 and a plating layer 52, both of which made of copper. A thickness of the metal thin film 51 is not less than 0.08 μm and not more than 1 μm, and preferably not less than 0.1 μm and not more than 0.5 μm, for example. A thickness of the plating layer 52 is not less than 2 μm and not more than 25 μm, and preferably not less than 3 μm and not more than 20 μm, for example.

According to the results of a fourth simulation which will be described later, when the width W1 of the transmission line 20a, the width W2 of the transmission line 20b and the spacing S between the transmission lines 20a, 20b are fixed, the differential impedance Zdiff is decreased as the thickness of the shield layer 50 is increased, while the differential impedance Zdiff is increased as the thickness of the shield layer 50 is reduced.

Therefore, the thickness of a part of the shield layer 50 overlapping the second area a2 is set smaller than the thickness of another part of the shield layer 50 overlapping the first, third and fourth areas a1, a3, a4. Thus, the adjustable range of the differential impedance Zdiff is expanded.

Namely, when the differential impedance Zdiff cannot be increased sufficiently in the second area a2 even though the thickness t40 of the ground conductor layer 40 is controlled, the thickness of the part of the shield layer 50 overlapping the second area a2 is reduced. Accordingly, the increase of the differential impedance Zdiff is further enhanced. As a result, the continuity of the differential impedance Zdiff is ensured.

It is preferable that the thickness of the part of the shield layer 50 overlapping the second area a2 is set sufficiently smaller than the skin depth of the shield layer 50 for the frequency of digital signal. Even in this case, it is possible to expand the controllable range of the differential impedance Zdiff. As a result, the continuity of the differential impedance Zdiff can be easily ensured.

The FPC board 1 of this embodiment is manufactured as follows. After the steps of FIGS. 4(c), (d), the metal thin film 51 is formed on the upper surface of the cover insulating layer 30 by a common method such as sputtering, vapor deposition, or electroless plating. Then, the plating layer 52 is formed on the metal thin film 51 by electrolytic plating in the area except the part overlapping the second area a2. In this manner, the FPC board 1 is completed.

In this embodiment, instead of copper, another metal such as gold, nickel or aluminum, or an alloy such as a copper alloy or an aluminum alloy may be used as the material for the metal thin film 51 and the plating layer 52.

(2) Fourth Simulation

For the FPC board 1 with the shield layer 50 formed therein, a relationship between the differential impedance Zdiff and the thickness of the shield layer 50 is obtained by a fourth simulation.

Specifically, a relationship between the differential impedance Zdiff and the thickness t40 of the ground conductor layer 40 is obtained for each of three types of FPC boards 1 in which the spacing S between the transmission lines 20a, 20b is 50 μm, 75 μm, or 100 μm, and the widths W1, W2 of the transmission lines 20a, 20b is constant at 40 μm. The thickness of the shield layer 50 is set from about 0.07 μm to 10 μm. In this embodiment, the frequency of the digital signal transmitted through the differential transmission path 20 is 1 GHz. Therefore, the skin depth of the shield layer 50 is 2.09 μm.

In the fourth simulation, the widths W1, W2 are set the same and constant from one end to the other end of each line. Also, the spacing S between the transmission lines 20a, 20b is set the same and constant from one end to the other end of each line. In addition, the thickness t40 of the ground conductor layer 40 opposite to the transmission lines 20a, 20b across the base insulating layer 10 is set constant. Further, the thickness of the shield layer 50 opposite to the transmission lines 20a, 20b with the cover insulating layer 30 sandwiched therebetween is set constant. The thickness t20 of the transmission lines 20a, 20b is 13 μm, and the thickness t10 of the base insulating layer 10 is 25 μm. The thickness t30 of the cover insulating layer 30 is 38 μm.

FIG. 9 is a graph showing the results of a fourth simulation. In FIG. 9, the vertical axis indicates the differential impedance Zdiff of the differential transmission paths 20 and the horizontal line indicates the thickness of the shield layer 50.

As shown in FIG. 9, when the spacing S between the transmission lines 20a, 20b is 50 μm, the differential impedance Zdiff is decreased as the thickness of the shield layer 50 approaches 1 μm from about 0.07 μm. When the thickness of the shield layer 50 is in the range from 1 μm to 10 μm, the differential impedance Zdiff is substantially constant.

Similarly, when the spacing S between the transmission lines 20a, 20b is 75 μm and 100 μm, the differential impedance Zdiff of the differential transmission path 20 is decreased as the thickness of the shield layer 50 approaches 1 μm from about 0.07 μm. When the thickness of the shield layer 50 is in the range from 1 μm to 10 μm, the differential impedance Zdiff of the differential transmission path 20 is substantially constant.

Thus, when the spacing S between the transmission lines 20a, 20b is constant, it becomes apparent that the differential impedance Zdiff of the differential transmission path 20 can be controlled by adjusting the thickness of the shield layer 50 in the range from about 0.07 μm to 1 μm, which is smaller than the skin depth (2.09 μm) of the shield layer 50.

[3] Third Embodiment

The configuration of an FPC board according to a third embodiment will be described below in terms of differences from the FPC board 1 according to the second embodiment.

Figure 10:
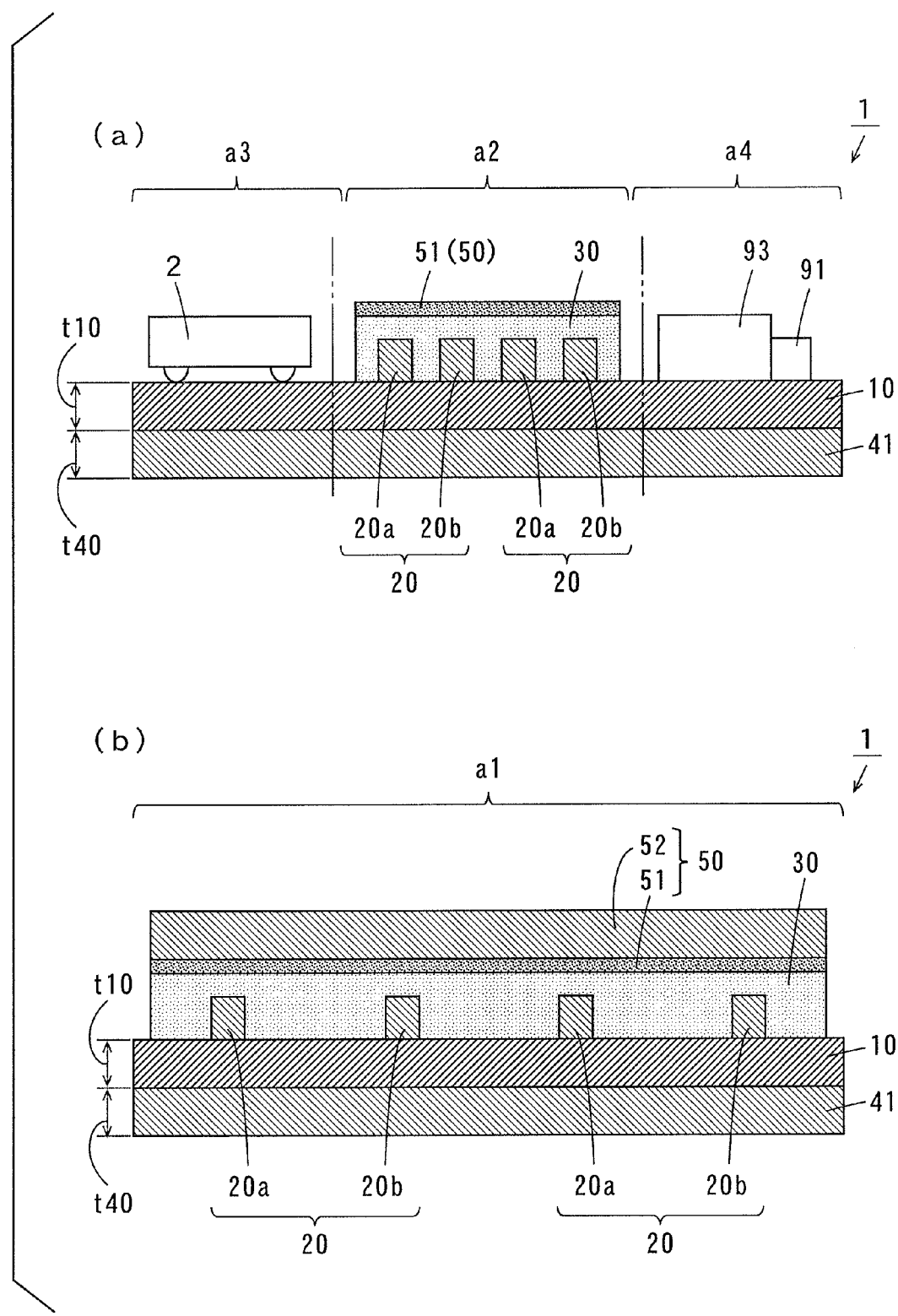
FIGS. 10(a) and (b) are sectional views showing the configuration of an FPC board according to a third embodiment.

FIG. 10 shows sectional view illustrating the configuration of the FPC board according to the third embodiment. FIG. 10(a) is a sectional view corresponding to the cross section taken along the line A-A of FIG. 1 and FIG. 10(b) is a sectional view corresponding to the cross section taken along the line B-B of FIG. 1.

As shown in FIGS. 10(a), (b), the FPC board 1 according to the third embodiment includes a second conductor layer 41 having a fixed thickness t40 and formed on the lower surface of the base insulating layer 10 of FIG. 8. It is noted that no metal thin film 42 of FIG. 8 is formed on the lower surface of the second conductor layer 41.

As shown in FIG. 10, in the FPC board 1 according to this embodiment, when the thickness of a part of the shield layer 50 overlapping the second area a2 is set smaller than the thickness of another part of the shield layer 50 overlapping the first, third and fourth areas a1, a3, a4, the thickness t4 of the ground conductor layer 40 in the first to fourth areas a1 to a4 may be set constant. Even in this case, the differential impedance Zdiff of the differential transmission path 20 can be controlled. Therefore, the continuity of the differential impedance can be ensured.

[4] Fourth Embodiment

The configuration of an FPC board according to a fourth embodiment will be described below, together with the manufacturing method thereof, in terms of differences from the FPC board 1 according to the first embodiment.

Figure 11:
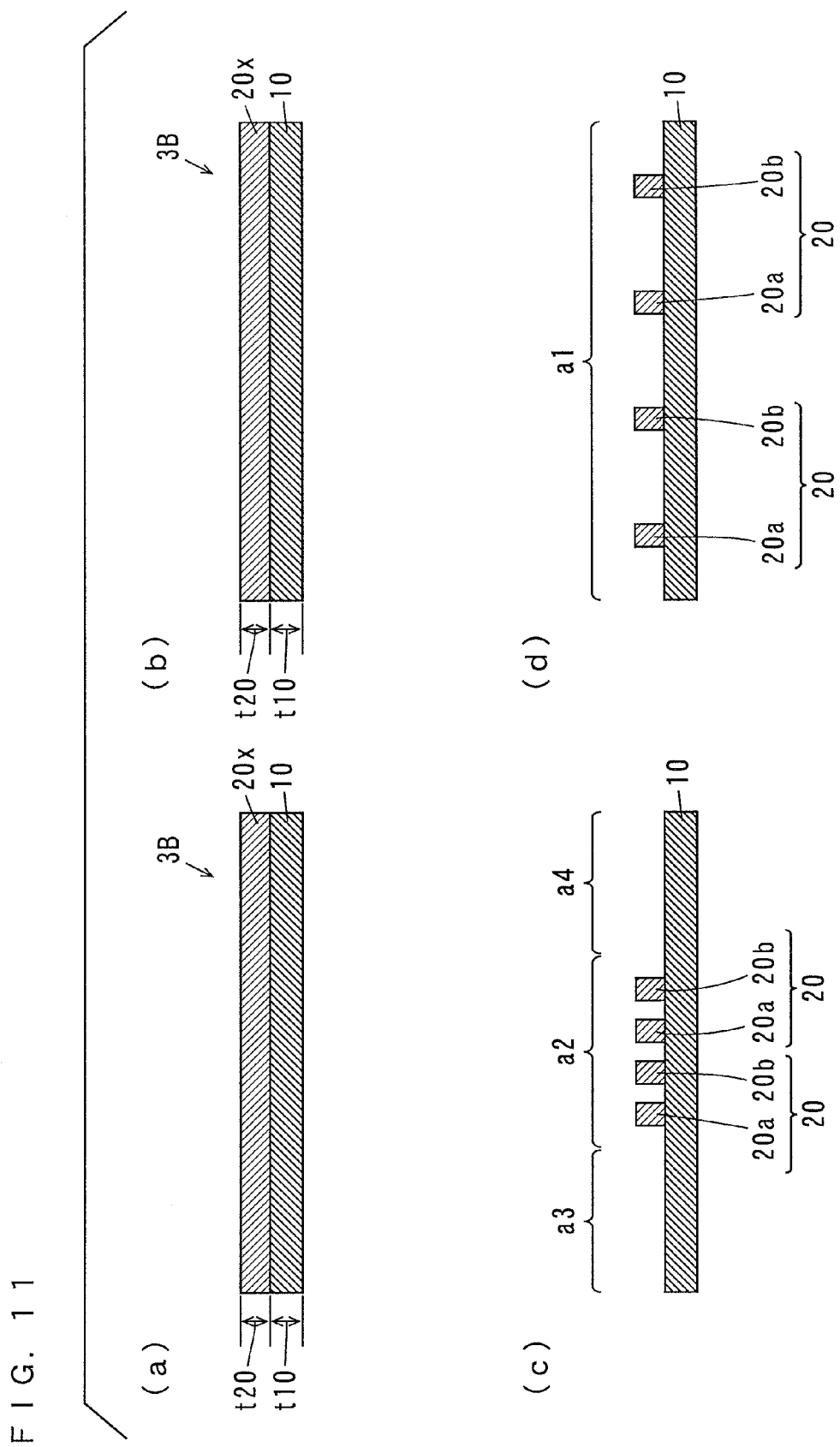
FIGS. 11(a) to (d) are schematic sectional views of process steps showing a method of manufacturing an FPC board according to a fourth embodiment of the present invention.
Figure 12:
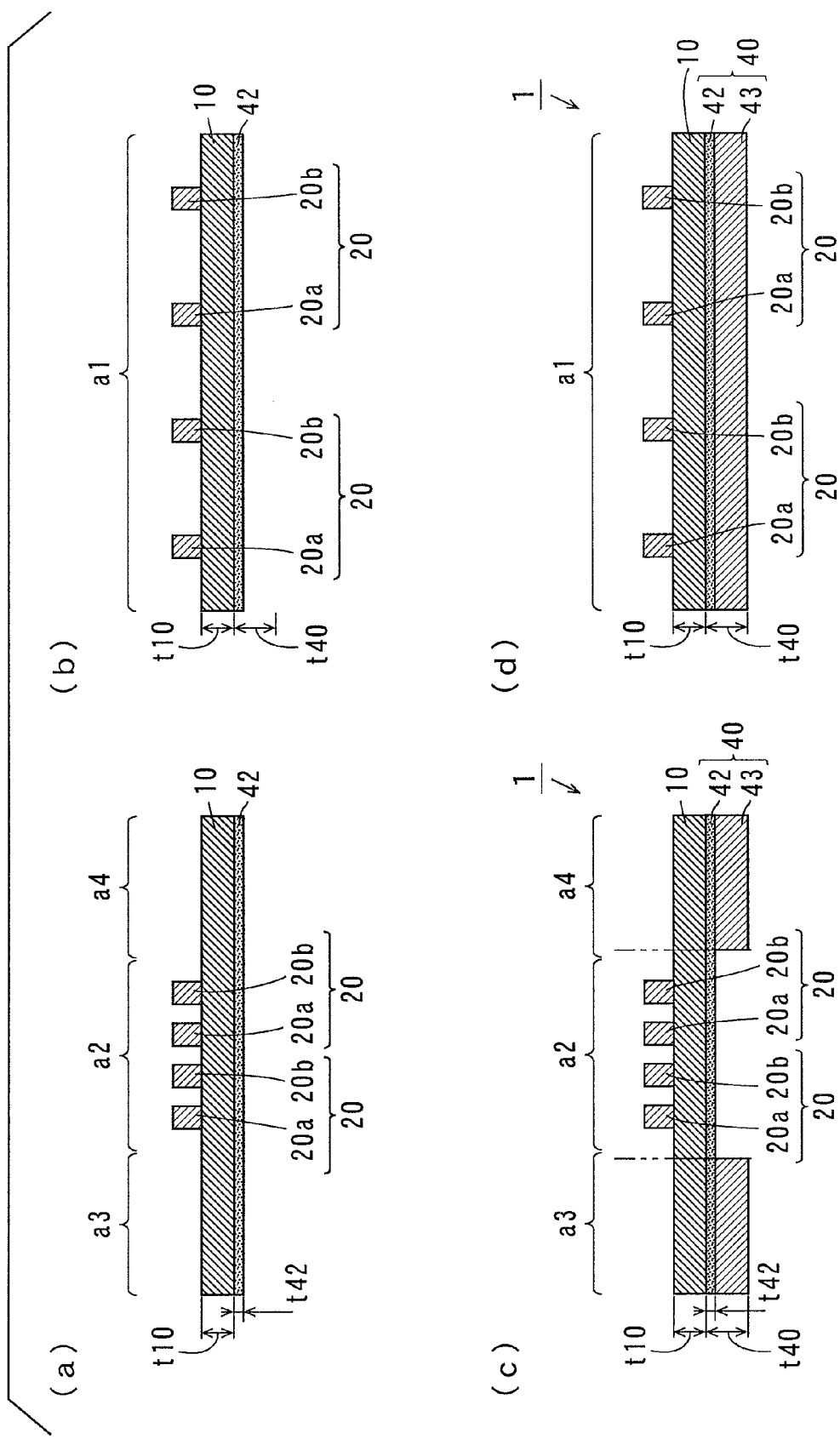
FIGS. 12(a) to (d) are schematic sectional views of process steps showing a method of manufacturing an FPC board according to a fourth embodiment of the present invention.

FIGS. 11 and 12 are schematic sectional views of process steps showing the method of manufacturing the FPC board according to the fourth embodiment. FIGS. 11(a), (c) and FIGS. 12(a), (c) are sectional views corresponding to the cross section taken along the line A-A of FIG. 1 and FIGS. 11(b), (d) and FIGS. 12(b), (d) are sectional views corresponding to the cross section taken along the line B-B of FIG. 1.

First, as shown in FIGS. 11(a), (b), a two layer base material 3B is prepared. A first conductor layer 20x is provided on the base insulating layer 10 of the two layer base material 3B. Next, as shown in FIGS. 11(c), (d), the first conductor layer 20x is patterned to form two differential transmission paths 20 on the upper surface of the base insulating layer 10.

Subsequently, as shown in FIGS. 12(a), (b), a metal thin film 42 is formed to cover the lower surface of the base insulating layer 10 by a common method such as sputtering, vapor deposition, or electroless plating. The metal thin film 42 is a copper thin film. The thickness t42 of the metal thin film 42 is not less than 0.08 μm and not more than 1 μm, and preferably not less than 0.1 μm and not more than 0.5 μm, for example.

After this, as shown in FIGS. 12(c), (d), a plating layer 43 is formed on the lower surface of the metal thin film 42, except for the part of the metal thin film 42 overlapping the second area a2. The plating layer 43 is made of copper. The thickness of the plating layer 43 is not less than 2 μm and not more than 25 μm, and preferably not less than 3 μm and not more than 20 μm, for example.

Finally, as in the steps of FIGS. 4(c), (d), a cover insulating layer 30 made of polyimide is formed on the upper surface of the base insulating layer 10. Thus, the FPC board 1 is completed.

As the material for the metal thin film 42 and the plating layer 43, another material such as gold, nickel or aluminum, or an alloy such as a copper alloy or an aluminum alloy may be used instead of copper.

[5] Fifth Embodiment

The configuration of an FPC board according to a fifth embodiment will be described below, together with the manufacturing method thereof, in terms of differences from the FPC board 1 according to the fourth embodiment.

Figure 13:
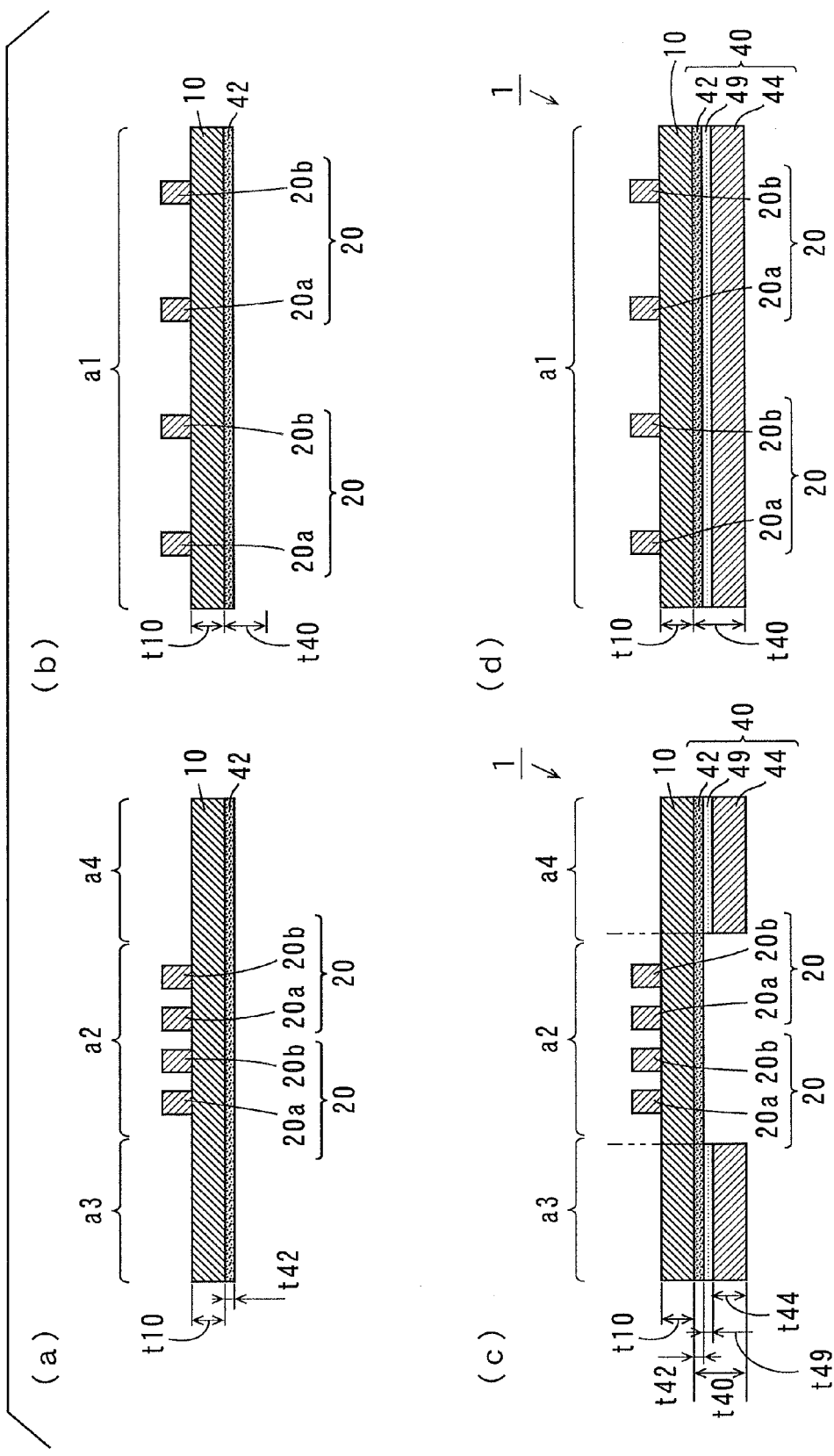
FIGS. 13(a) to (d) are schematic sectional views of process steps showing a method of manufacturing an FPC board according to a fifth embodiment.

FIG. 13 show sectional views of process steps illustrating a method of manufacturing the FPC board according to the fifth embodiment. FIGS. 13(a), (c) are sectional views corresponding to the cross section taken along the line A-A of FIG. 1, and FIGS. 13(b), (d) are sectional views corresponding to the cross section taken along the line B-B of FIG. 1.

After the step of FIGS. 11 (a), (b), two differential transmission paths 20 are formed on the upper surface of the base insulating layer 10, and the metal thin film 42 is formed to cover the lower surface of the base insulating layer 10, as shown in FIGS. 13(a), (b). The metal thin film 42 is a copper thin film. The thickness t42 of the metal thin film 42 is not less than 0.08 μm and not more than 1 μm, and preferably not less than 0.1 μm and not more than 0.5 μm, for example.

Subsequently, as shown in FIGS. 13(c), (d), a conductive adhesive layer 49 is formed on the lower surface of the metal shin film 42, except for the part of the metal thin film 42 overlapping the second area a2, and a metal film 44 is attached to the lower surface of the adhesive layer 49. The conductive adhesive layer 49 may be formed using an epoxy-based resin in which particulates of conductive materials such as metal are dispersed. A thickness t49 of the adhesive layer 49 is not less than 5 μm and not more than 25 μm, and preferably not less than 5 μm and not more than 15 μm.

The metal film 44 is a copper film. The thickness t44 of the metal thin film 44 is not less than 2 μm and not more than 25 μm, and preferably not less than 3 μm and not more than 20 μm.

Finally, as in the steps of FIGS. 4(c), (d), the cover insulating layer 30 made of polyimide is formed on the upper surface of the base insulating layer 10. Thus, the FPC board 1 is completed.

As the material for the metal thin film 42 and the metal film 44, another metal such as gold, nickel or aluminum, or an alloy such as a copper alloy or an aluminum alloy may be used instead of copper.

[6] Sixth Embodiment

Figure 14:
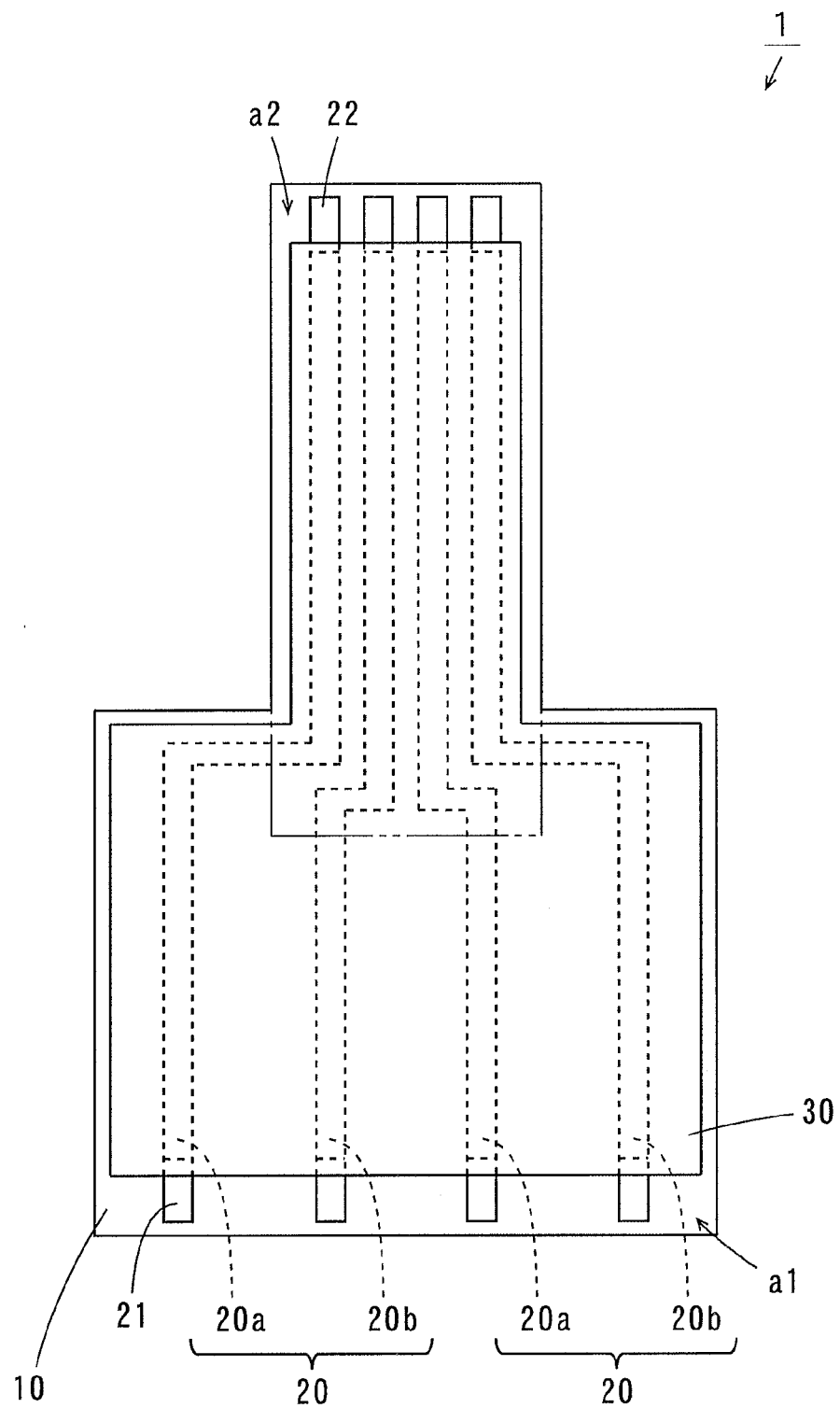
FIG. 14 is a schematic plan view showing an FPC board according to a sixth embodiment.

FIG. 14 is a schematic plan view showing an FPC board according to a sixth embodiment. As shown in FIG. 14, in the FPC board 1 according to this embodiment, no base insulating layer 10 exists at a part corresponding to the third and fourth areas a3, a4 of FIG. 1. Therefore, the width of the FPC board 1 is changed incrementally in the longitudinal direction of two differential transmission paths 20. Even in this case, it is possible to ensure the continuity of the differential impedance Zdiff of the differential transmission paths 20 formed on the base insulating layer 10 by partially adjusting the thickness t40 of the ground conductor layer 40 overlapping the first and second areas a1, a2.

[7] Seventh Embodiment

FIG. 15 show schematic sectional views illustrating an FPC board according to a seventh embodiment. FIG. 15(a) is a sectional view of a part of the FPC board 1 where the spacing S between the transmission lines 20a, 20b is small, and FIG. 15(b) is a sectional view of another part of the FPC board 1 where the spacing S between the transmission lines 20a, 20b is large.

As shown in FIGS. 15(a), (b), in the FPC board 1 according to this embodiment, the differential transmission paths 20 are formed on both upper and lower surfaces of the base insulating layer 10. As such, when the differential transmission paths 20 are formed on the upper and lower surfaces of the base insulating layer 10, the differential transmission paths 20 and the ground conductor layer 40 are arranged to be opposite to each other with the base insulating layer 10 sandwiched therebetween. Thus, the freedom of layout of the differential transmission paths 20 is further improved.

[8] Correspondence Between Elements in the Claims and Parts in Embodiments

In the following paragraph, non-limiting examples of correspondences between various elements recited in the claims below and those described above with respect to various preferred embodiments of the present invention are explained.

In the above embodiments, the base insulating layer 10 or the cover insulating 30 is an example of the first insulating layer; the transmission lines 20a, 20b are examples of the first and second transmission lines, respectively, the differential transmission path 20 is examples of the differential transmission path, and the ground conductor layer 40 or the shield layer 50 is an example of the first conductor layer.

Also, a part of the differential transmission path 20 formed on the second area a2 is an example of the part of the differential transmission path, another part of the differential transmission path 20 formed on the first area a1 is an example of another part of the differential transmission path 20, and the thickness t42 of the part of the ground conductor layer 40 overlapping the second area a2 and the thickness of the part of the metal thin film 51 overlapping the second area a2 are examples of the thickness of the part of the first conductor layer overlapping the part of the differential transmission path.

Further, the thickness t40 of the part of the ground conductor layer 40 overlapping the first area a1 and the thickness of the part of the shield layer 50 overlapping the first area a1 are examples of the part of the first conductor layer overlapping another part of the differential transmission path. The cover insulating layer 30 or the base insulating layer 10 is an example of the second insulating layer, and the shield layer 50 is an example of the second conductor layer.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

I claim:
1. A printed circuit board, comprising:
a first insulating layer;
a differential transmission path composed of first and second transmission lines; and
a ground conductor layer, wherein
said ground conductor layer, said first insulating layer and said differential transmission path are stacked such that said ground conductor layer is opposite to said differential transmission path with said first insulating layer sandwiched therebetween,
a spacing between said first and second transmission lines at one part of said differential transmission path is smaller than a spacing between said first and second transmission lines at another part of said differential transmission path, said ground conductor layer including first and second conductor layers, said first conductor layer being formed to overlap the one part and the other part of said differential transmission path, said second conductor layer being formed to overlap the other part of said differential transmission path and not to overlap the one part of said differential transmission path, said second conductor layer being stacked on said first conductor layer so as to come into contact with said first conductor layer, and a thickness of a part of said ground conductor layer overlapping said one part of said differential transmission path is smaller than a thickness of another part of said ground conductor layer overlapping the other part of said differential transmission path.

2. The printed circuit board according to claim 1, wherein said first insulating layer includes one surface and another surface, said differential transmission path being formed on the one surface of said first insulating layer, and wherein said ground conductor layer is formed on the other surface of said first insulating layer.

3. The printed circuit board according to claim 2, further comprising:

a second insulating layer formed on the one surface of said first insulating layer so as to cover said differential transmission path; and a shield layer formed on said second insulating layer so as to be opposite to said differential transmission path with said second insulating layer sandwiched therebetween, wherein a thickness of a part of said shield layer overlapping the one part of said differential transmission path is smaller than a thickness of another part of said shield layer overlapping the other part of said differential transmission path.

4. The printed circuit board according to claim 2, wherein one surface of said second conductor layer is in contact with the other surface of said first insulating layer in a region overlapping the other part of said differential transmission path, and wherein one surface of said first conductor layer is in contact with the other surface of said first insulating layer in a region overlapping the one part of said differential transmission path, and is in contact with another surface of said second conductor layer in a region overlapping the other part of said differential transmission path.

5. The printed circuit board according to claim 1, further comprising a second insulating layer having one surface, wherein said differential transmission path is formed on the one surface of said second insulating layer, said first insulating layer being formed on said one surface of said second insulating layer so as to cover said differential transmission path, and said ground conductor layer is formed on said first insulating layer so as to be opposite to said differential transmission path with said first insulating layer sandwiched therebetween.

6. The printed circuit board according to claim 1, wherein the thickness of a part of said ground conductor layer overlapping the one part of said differential transmission path is smaller than a skin depth of said ground conductor layer for a frequency of a signal transmitted through said differential transmission path.

7. The printed circuit board according to claim 1, wherein widths of said first and second transmission lines at the one part of said differential transmission path are equal to widths of said first and second transmission lines at the other part of said differential transmission path, respectively.

8. The printed circuit board according to claim 1, wherein said first and second conductor layers are formed of a same metal material.

9. A method of manufacturing a printed circuit board, comprising the step of:

fabricating a stack of a ground conductor layer including first and second conductor layers, a first insulating layer, and a differential transmission path composed of first and second transmission lines such that said ground conductor layer is opposite to said differential transmission path with said first insulating layer sandwiched therebetween, wherein said step of fabricating the stack includes the steps of:

forming said differential transmission path such that a spacing between said first and second transmission lines at a part of said differential transmission path is smaller than a spacing between said first and second transmission lines at another part of said differential transmission path, and forming said ground conductor layer such that a thickness of a part of said ground conductor layer overlapping the one part of said differential transmission path is smaller than a thickness of another part of said ground conductor layer overlapping the other part of said differential transmission path by forming said first conductor layer so as said first conductor layer overlaps the one part and the other part of said differential transmission path, and forming said second conductor layer such that said second conductor layer:

overlaps the other part of said differential transmission path, and contacts said first conductor layer without overlapping the one part of said differential transmission path.

10. The method of manufacturing a printed circuit board according to claim 9, wherein said first insulating layer has one surface and another surface, said step of forming said differential transmission path includes forming said differential transmission path on the one surface of said first insulating layer, and said step of forming said ground conductor layer includes forming said ground conductor layer on said another surface of said first insulating layer.

11. The method of manufacturing a printed circuit board according to claim 10, further comprising the steps of:

forming a second insulating layer on said one surface of the first insulating layer so as to cover said differential transmission path; and forming a shield layer on said second insulating layer such that said shield layer is opposite to said differential transmission path with said second insulating layer sandwiched therebetween, wherein said step of forming said shield layer includes forming said shield layer such that a thickness of a part of said shield layer overlapping said one part of said differential transmission path is smaller than a thickness of another part of said shield layer overlapping the other part of said differential transmission path.

12. The method of manufacturing a printed circuit board according to claim 10, wherein said step of forming said ground conductor layer includes the steps of:

forming said second conductor layer such that one surface of said second conductor layer contacts the other surface of said first insulating layer in a region overlapping the other part of said differential transmission path, and forming said first conductor layer such that one surface of said first conductor layer contacts the other surface of said first insulating layer in a region overlapping the one part of said differential transmission path and contacts another surface of said second conductor layer in a region overlapping the other part of said differential transmission path.

13. The method of manufacturing a printed circuit board according to claim 9, wherein said step of fabricating the stack further includes forming said first insulating layer, said step of forming said differential transmission path includes forming said differential transmission path on one surface of a second insulating layer having the one surface, said step of forming said first insulating layer includes forming said first insulating layer on the one surface of said second insulating layer so as to cover said differential transmission path, and said step of forming said ground conductor layer includes forming said ground conductor layer on said first insulating layer such that said ground conductor layer is opposite to said differential transmission path with said first insulating layer sandwiched therebetween.

14. The method of manufacturing a printed circuit board according to claim 9, wherein said step of forming said ground conductor layer includes making the thickness of a part of said ground conductor layer overlapping said one part of said differential transmission path smaller than a skin depth of said ground conductor layer for a frequency of a signal transmitted through said differential transmission path.

15. The method of manufacturing a printed circuit board according to claim 9, wherein said step of forming said differential transmission path includes the step of forming said differential transmission path such that widths of said first and second transmission lines at the one part of said differential transmission path are equal to widths of said first and second transmission lines at the other part of said differential transmission path, respectively.

16. The method of manufacturing a printed circuit board according to claim 9, wherein said step of forming said ground conductor layer includes the step of forming said first and second conductor layers of a same metal material.

* * * * *